(12) United States Patent
Ding

(10) Patent No.: US 7,148,104 B2
(45) Date of Patent: *Dec. 12, 2006

(54) FABRICATION OF CONDUCTIVE LINES INTERCONNECTING FIRST CONDUCTIVE GATES IN NONVOLATILE MEMORIES HAVING SECOND CONDUCTIVE GATES PROVIDED BY CONDUCTIVE GATE LINES, WHEREIN THE ADJACENT CONDUCTIVE GATE LINES FOR THE ADJACENT COLUMNS ARE SPACED FROM EACH OTHER, AND NON-VOLATILE MEMORY STRUCTURES

(75) Inventor: Yi Ding, Sunnyvale, CA (US)

(73) Assignee: ProMos Technologies Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/797,972

(22) Filed: Mar. 10, 2004

(65) Prior Publication Data
US 2005/0202632 A1    Sep. 15, 2005

(51) Int. Cl.
*H01L 21/8247* (2006.01)
(52) U.S. Cl. .............................. 438/257; 257/E21.179
(58) Field of Classification Search ........ 438/257–267; 257/E21.179
See application file for complete search history.

(56) References Cited

U.S. PATENT DOCUMENTS

| | | | |
|---|---|---|---|
| 5,402,371 A | 3/1995 | Ono | |
| 5,543,339 A * | 8/1996 | Roth et al. ................. | 438/265 |
| 5,856,943 A | 1/1999 | Jenq | |
| 5,901,084 A | 5/1999 | Ohnakado | |
| 6,057,575 A | 5/2000 | Jenq | |
| 6,130,129 A | 10/2000 | Chen | |
| 6,134,144 A | 10/2000 | Lin et al. | |
| 6,171,909 B1 | 1/2001 | Ding et al. | |
| 6,200,856 B1 | 3/2001 | Chen | |
| 6,261,893 B1 | 7/2001 | Chang et al. | |
| 6,266,278 B1 | 7/2001 | Harari et al. | |
| 6,326,661 B1 | 12/2001 | Dormans et al. | |
| 6,355,524 B1 | 3/2002 | Tuan et al. | |
| 6,365,457 B1 | 4/2002 | Choi | |
| 6,414,872 B1 | 7/2002 | Bergemont et al. | |

(Continued)

FOREIGN PATENT DOCUMENTS

EP    0 938 098 A2    8/1999

OTHER PUBLICATIONS

Wu, A.T.; Chan T.Y.; Ko, P.K.; and Hu, C. "A Novel High-Speed, 5-Volt Programming EPROM Structure With Source-Side Injection," 1986 IEEE, 584-587.

(Continued)

*Primary Examiner*—Richard A. Booth
(74) *Attorney, Agent, or Firm*—Michael Shenker; MacPherson Kwok Chen & Held LLP

(57) ABSTRACT

In a nonvolatile memory, the select gates (144S) are formed from one conductive layer (e.g. polysilicon or polyside), and the wordlines (144) interconnecting the select gates are made from a different conductive layer (e.g. metal). The wordlines overlie an dielectric (302, 304, 310) formed over control gate lines (134). Each control gate line provides control gates for one column of the memory cells. The adjacent control gate lines for the adjacent memory columns are spaced from each other. The dielectric thickness can be controlled to reduce the capacitance between the wordlines and the control gates. In some embodiments, the floating gates (120) are fabricated in a self-aligned manner using an isotropic etch of the floating gate layer.

19 Claims, 45 Drawing Sheets

U.S. PATENT DOCUMENTS

| | | |
|---|---|---|
| 6,420,231 B1 | 7/2002 | Harari et al. |
| 6,437,360 B1 | 8/2002 | Cho et al. |
| 6,438,036 B1 | 8/2002 | Seki et al. |
| 6,486,023 B1 | 11/2002 | Nagata |
| 6,518,618 B1 | 2/2003 | Fazio et al. |
| 6,541,324 B1 | 4/2003 | Wang |
| 6,541,829 B1 | 4/2003 | Nishinohara et al. |
| 6,787,415 B1 * | 9/2004 | Chung et al. ............... 438/257 |
| 2002/0064071 A1 | 5/2002 | Takahashi et al. |
| 2002/0197888 A1 | 12/2002 | Huang et al. |
| 2003/0218908 A1 | 11/2003 | Park et al. |
| 2004/0004863 A1 | 1/2004 | Wang |

OTHER PUBLICATIONS

Mizutani, Yoshihisa; and Makita, Koji "A New EPROM Cell With A Sidewall Floating Gate Fro High-Density and High Performance Device," 1985 IEEE, 635-638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split-Gate Source-Side-Injection Cell for 5V-Only Applications," 1994 Symposium on VLSI Technology Digest of Technical Papers, pp. 49-50.

Mih, Rebecca et al. "0.18um Modular Triple Self-Aligned Embedded Split-Gate Flash Memory," 2000 Symposium on VLSI Technology Digest of Technical Papers, pp. 120-121.

Ma, Yale et al., "A Dual-Bit Split-Gate EEPROM (DSG) Cell in Contactless Array for Single Vcc High Density Flash Memories," 1994 IEEE, 3.5.1-3.5.4.

Spinelli, Alessandro S., "Quantum-Mechanical 2D Simulation of Surface-and Buried-Channel p-MOS,"2000 International Conference on Simulation of Semiconductor Processes and Devices: SISPAD 2000, Seattle, WA Sep. 6-8, 2000.

Kim, K.S. et al. "A Novel Dual String NOR (DuSnor) Memory Cell Technology Scalabe to the 256 Mbit and 1 Gbit Flash Memories," 1995 IEEE 11.1.1-11.1.4.

Bergemont, A. et al."NOR Virtual Ground (NVG)—A New Scaling Concept for Very High Density FLAS EEPROM and its Implementation in a 0.5 um Process," 1993 IEEE 2.2.1-2.2.4.

Van Duuren, Michiel et al., "Compact poly-CMP Embedded Flash Memory Cells For One or Two Bit Storage," Philips Research Leuven, Kapeldreef 75, B3001 Leuven, Belgium, pp. 73-74.

U.S. Appl. No. 10/440,466, entitled "Fabrication Of Conductive Gates For Nonvolatile Memories From Layers With Protruding Portions," filed on May 16, 2003.

U.S. Appl. No. 10/440,005, entitled "Fabrication of Dielectric On A Gate Surface To Insulate The Gate From Another Element Of An Integrated Circuit," filed on May 16, 2003.

U.S. Appl. No. 10/440,508, entitled "Fabrication Of Gate Dielectric In Nonvolatile Memories Having Select, Floating And Control Gates," filed on May 16, 2003.

U.S. Appl. No. 10/440,500, entitled "Integrated Circuits With Openings that Allow Electrical Contact To Conductive Features Having Self-Aligned Edges," filed on May 16, 2003.

U.S. Appl. No. 10/393,212, entitled "Nonvolatile Memories And Methods Of Fabrication," filed on Mar. 19, 2003.

U.S. Appl. No. 10/411,813, entitled "Nonvolatile Memories With A Floating Gate Having An Upward Protrusion," filed on Apr. 10, 2003.

U.S. Appl. No. 10/393,202, entitled "Fabrication of Integrated Circuit Elements In Structures With Protruding Features," filed on Mar. 19, 2003.

U.S. Appl. No. 10/631,941, entitled "Nonvolatile Memory Cell With Multiple Floating Gates Formed After The Select Gate," filed on Jul. 30, 2003.

U.S. Appl. No. 10/632,155, entitled "Nonvolatile Memory Cells With Buried Channel Transistors," filed on Jul. 30, 2003.

U.S. Appl. No. 10/632,007, entitled "Arrays Of Nonvolatile Memory Cells Wherin Each Cell Has Two Conductive Floating Gates," filed on Jul. 30, 2003.

U.S. Appl. No. 10/631,452, entitled "Fabrication Of Dielectric For A Nonvolatile Memory Cell Having Multiple Floating Gates," filed on Jul. 30, 2003.

U.S. Appl. No. 10/632,154, entitled "Fabrication Of Gate Dielectric In Nonvolatile Memories In Which A Memory Cell Has Multiple Floating Gates," filed on Jul. 30, 2003.

U.S. Appl. No. 10/632,186, entitled "Nonvolatile Memory Cell With Multiple Floating Gates Formed After The Select Gate And Having Upward Protrusions," filed on Jul. 30, 2003.

U.S. Appl. No. 10/631,552, entitled "Nonvolatile Memories And Methods Of Fabrication," filed on Jul. 30, 2003.

Shirota, Riichiro "A Review of 256Mbit NAND Flash Memories and NAND Flash Future Trend," Feb. 2000, Nonvolatile Memory Workshop in Monterey, California, pp. 22-31.

U.S. Appl. No. 10/798,475, entitled "Fabrication Of Conductived Lines Interconnecting Conductive Gates In Nonvolatile Memories And Non-Volatile Memory Structures," filed on Mar. 10, 2004.

* cited by examiner

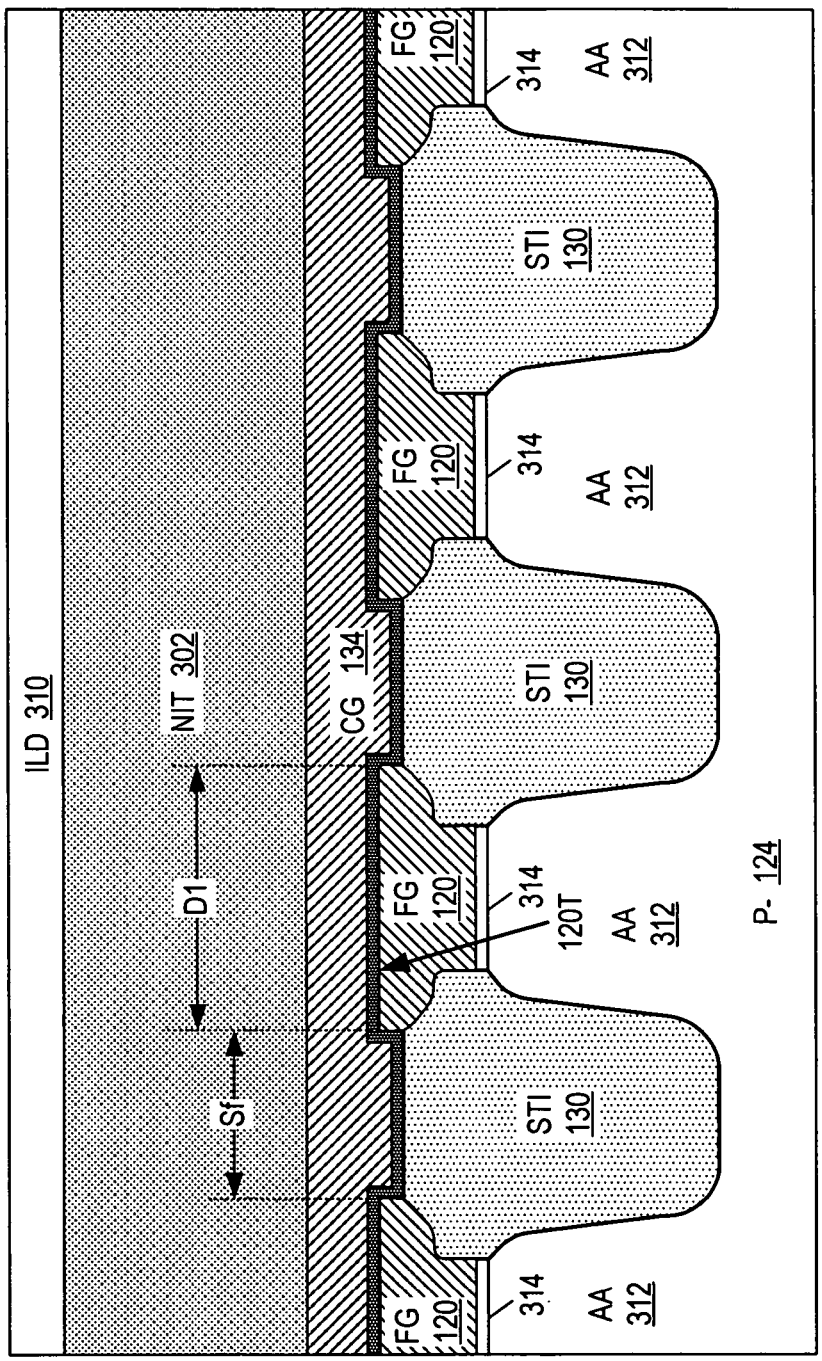

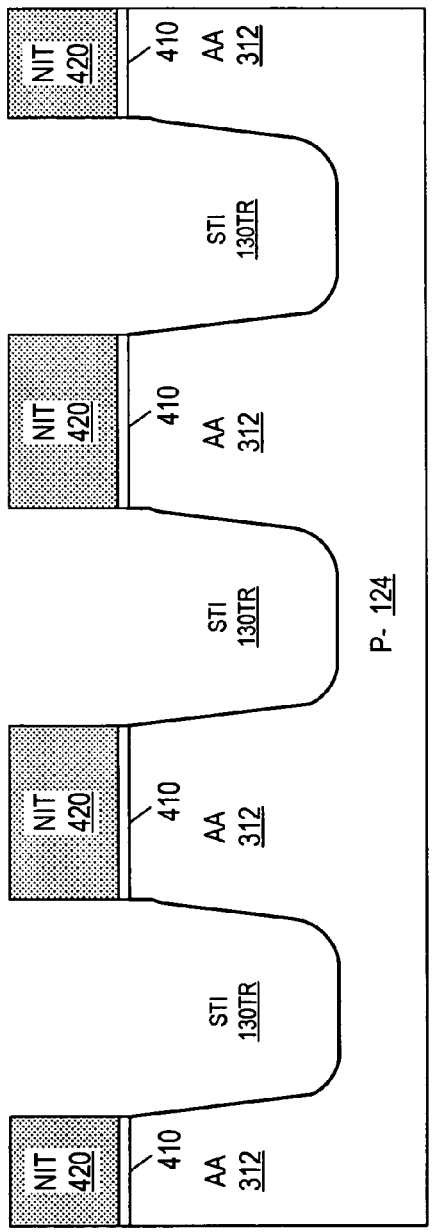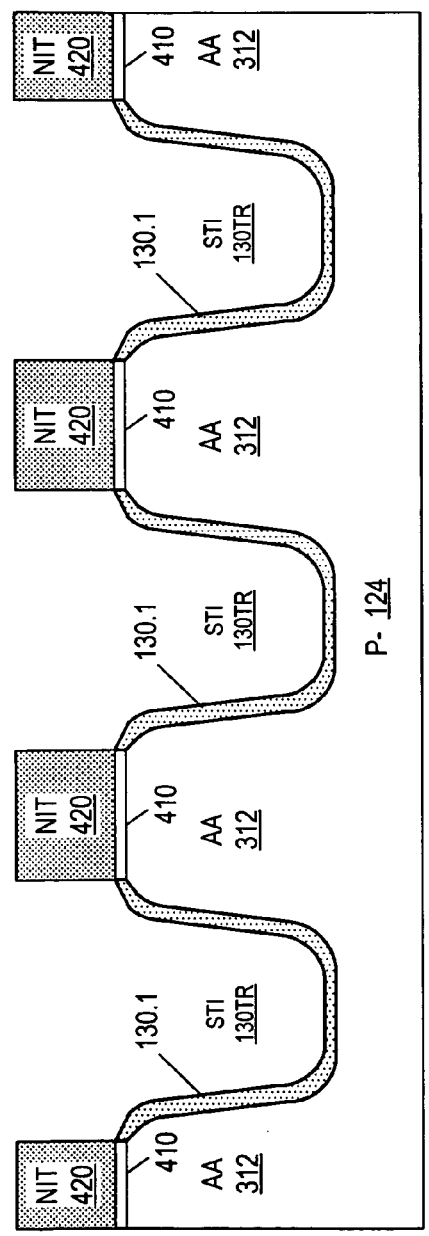

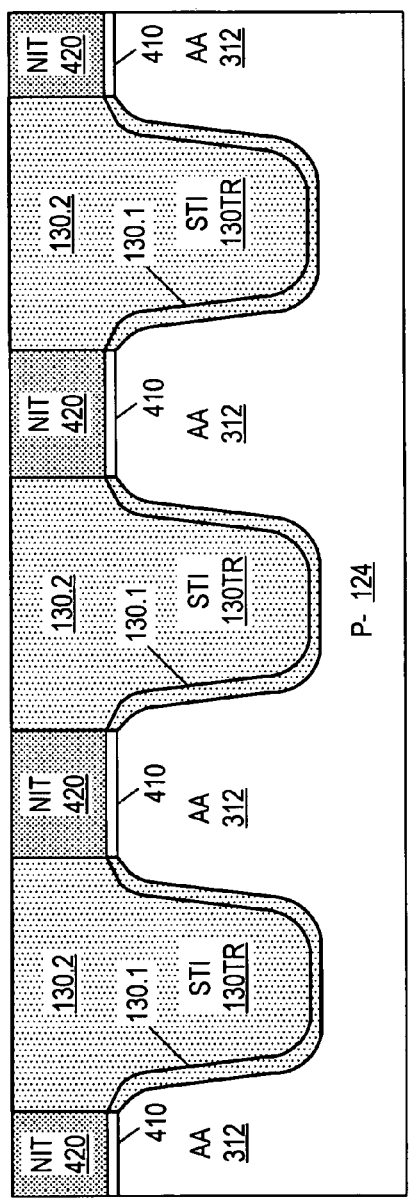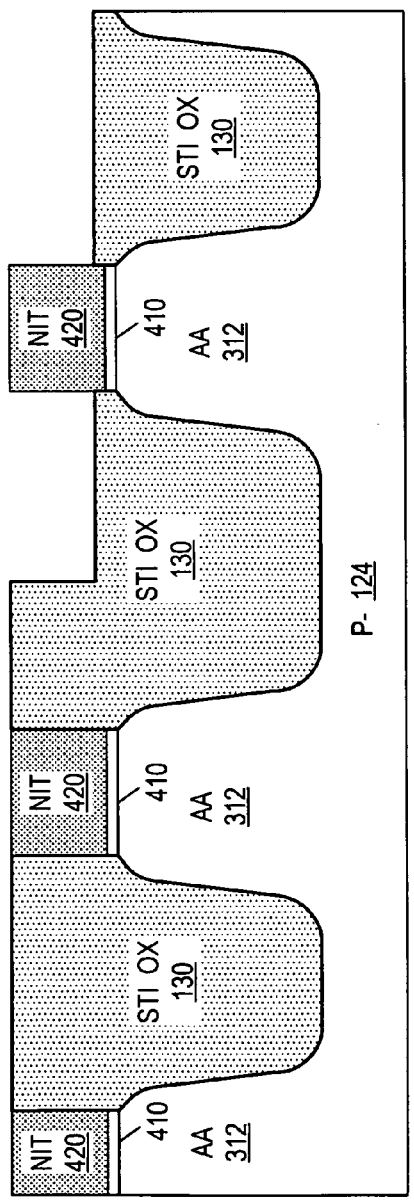

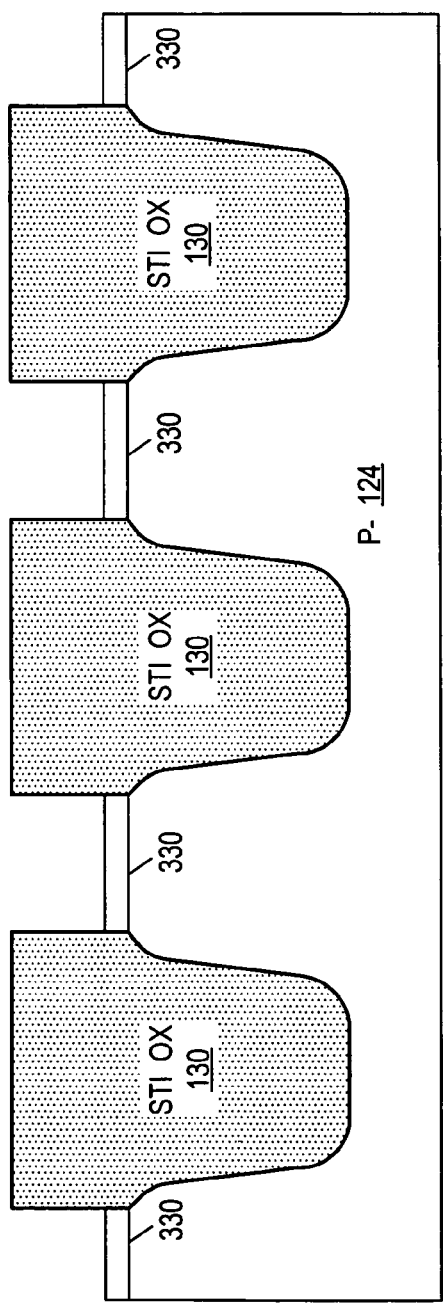
FIG. 8A
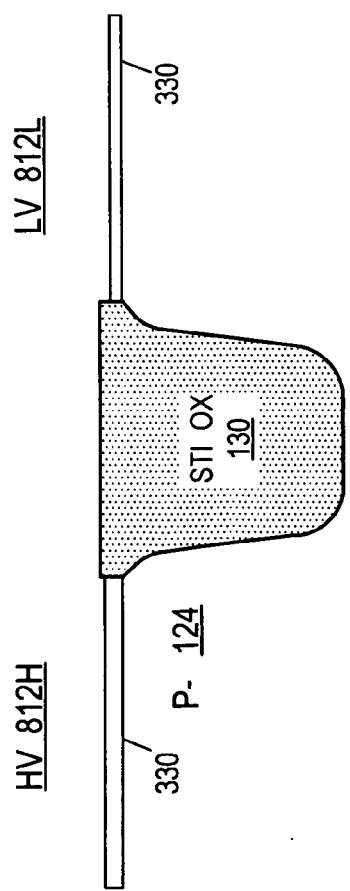
FIG. 8B (PERIPHERY)

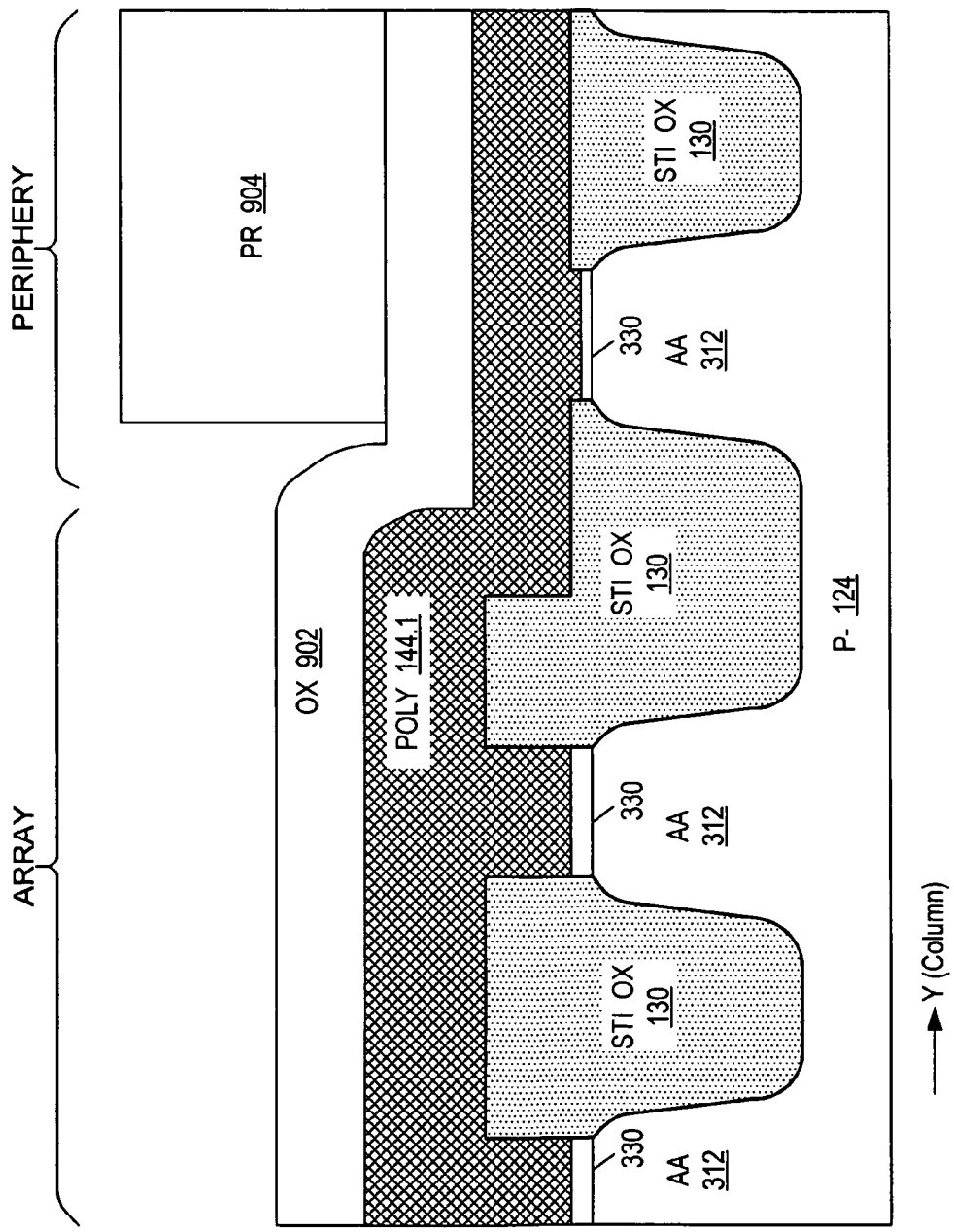

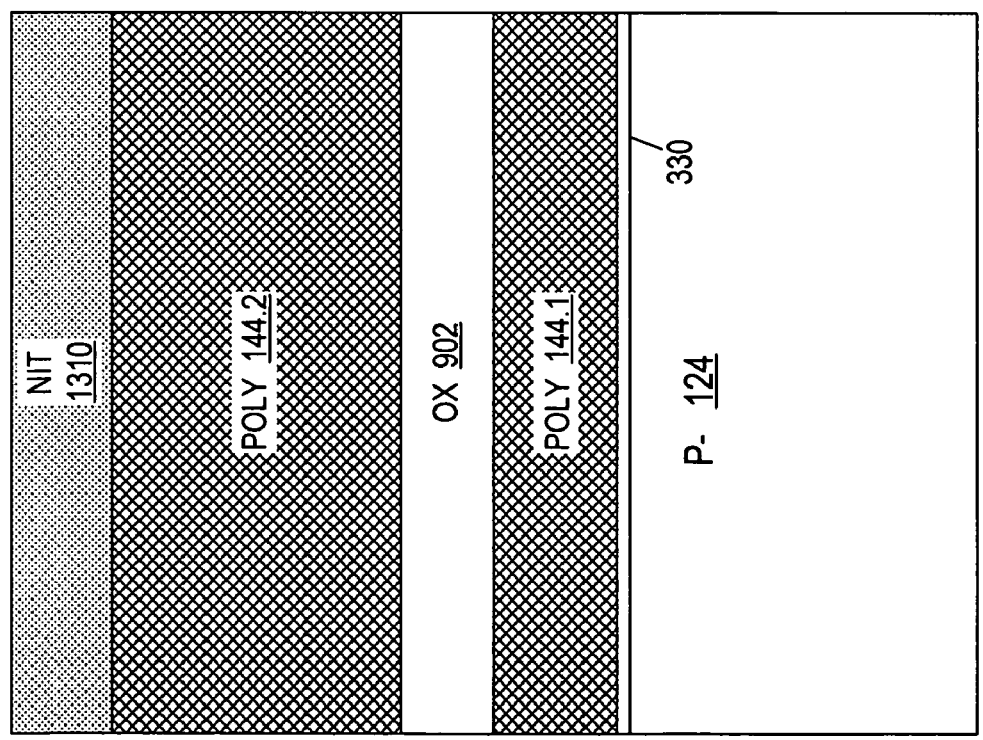
FIG. 13B (PERIPHERY)

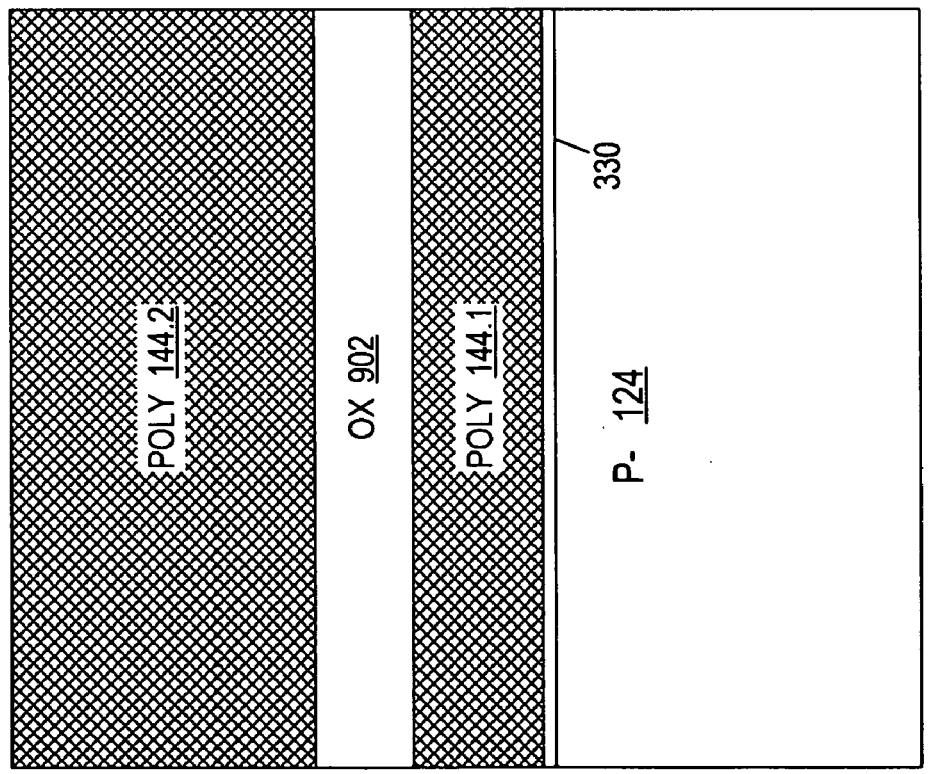
FIG. 14B (PERIPHERY)

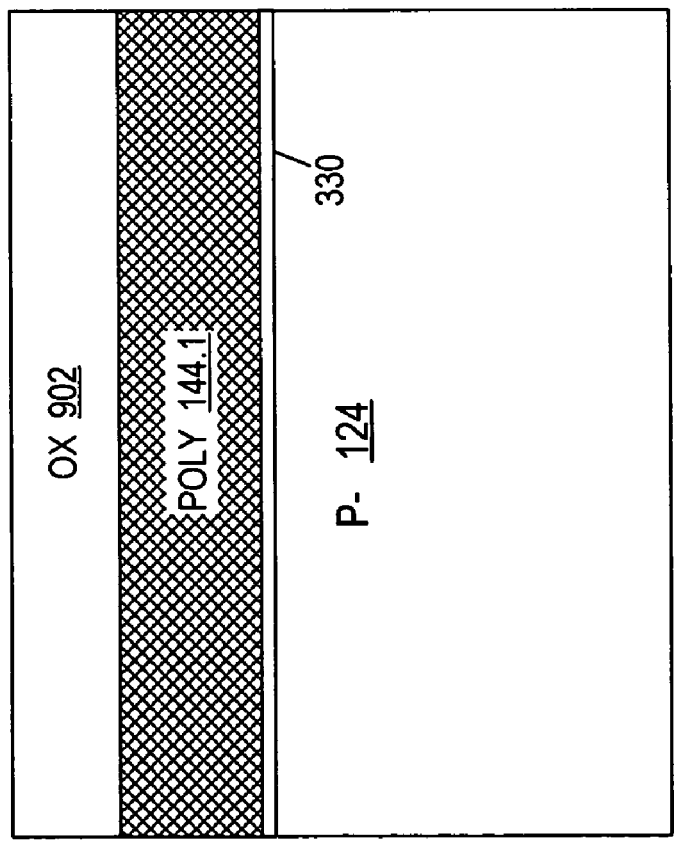
FIG. 15C (PERIPHERY)

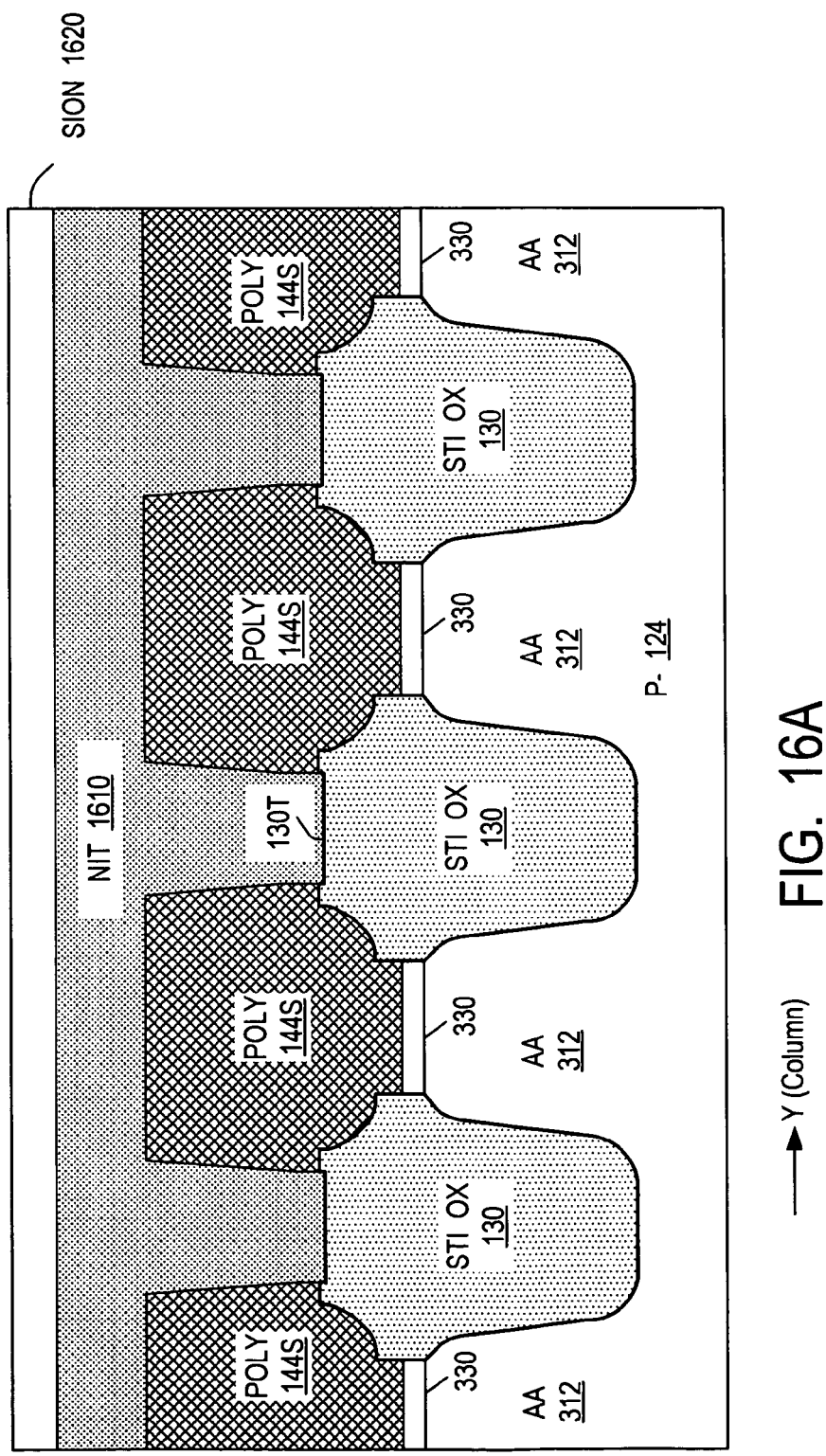

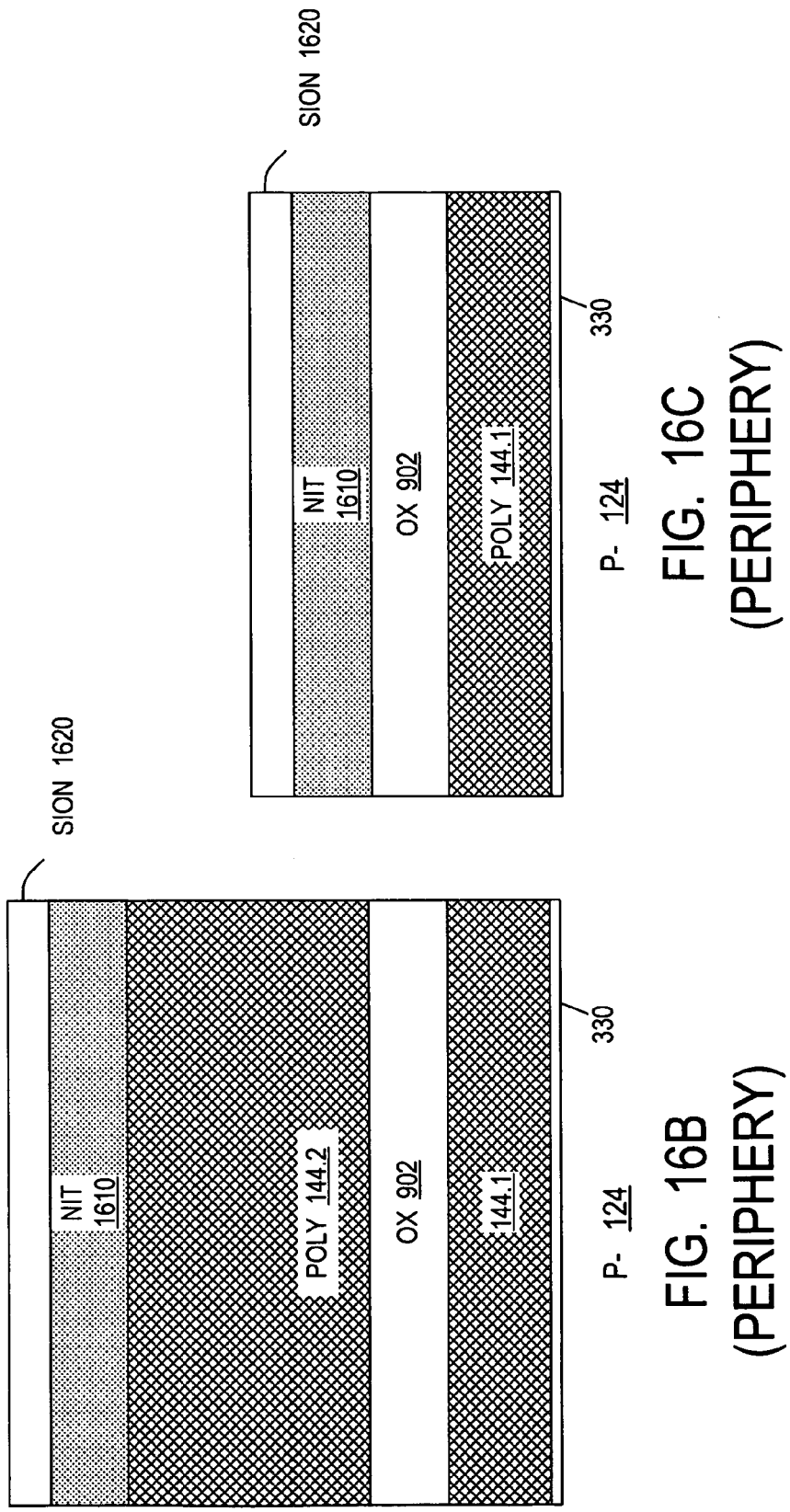

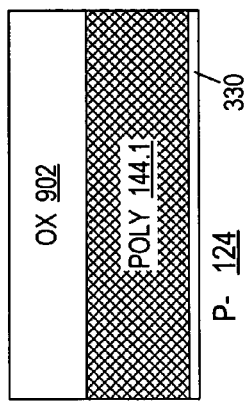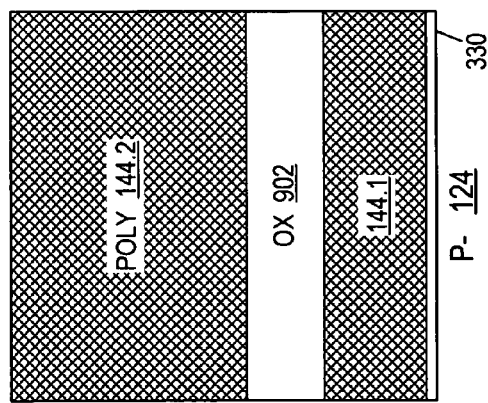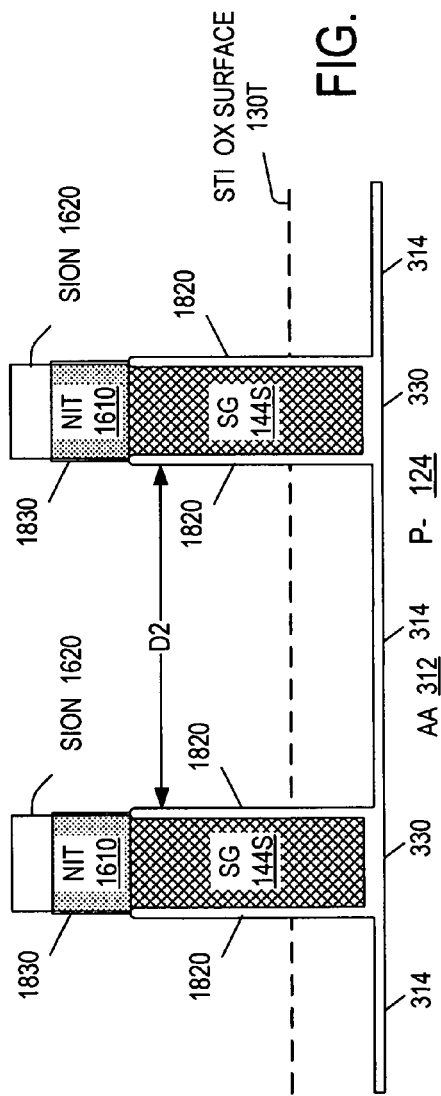

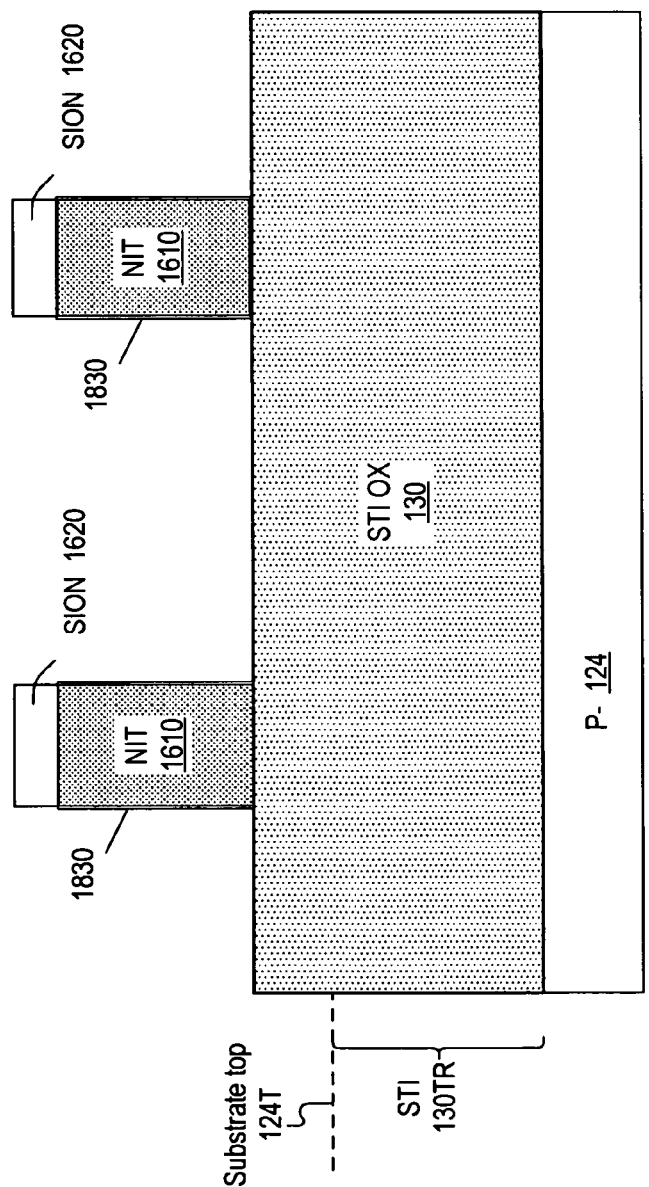
FIG. 18B (X-E)
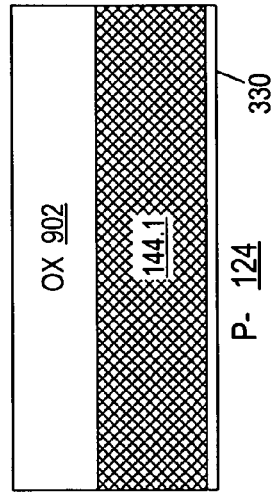
FIG. 18C (PERIPHERY)

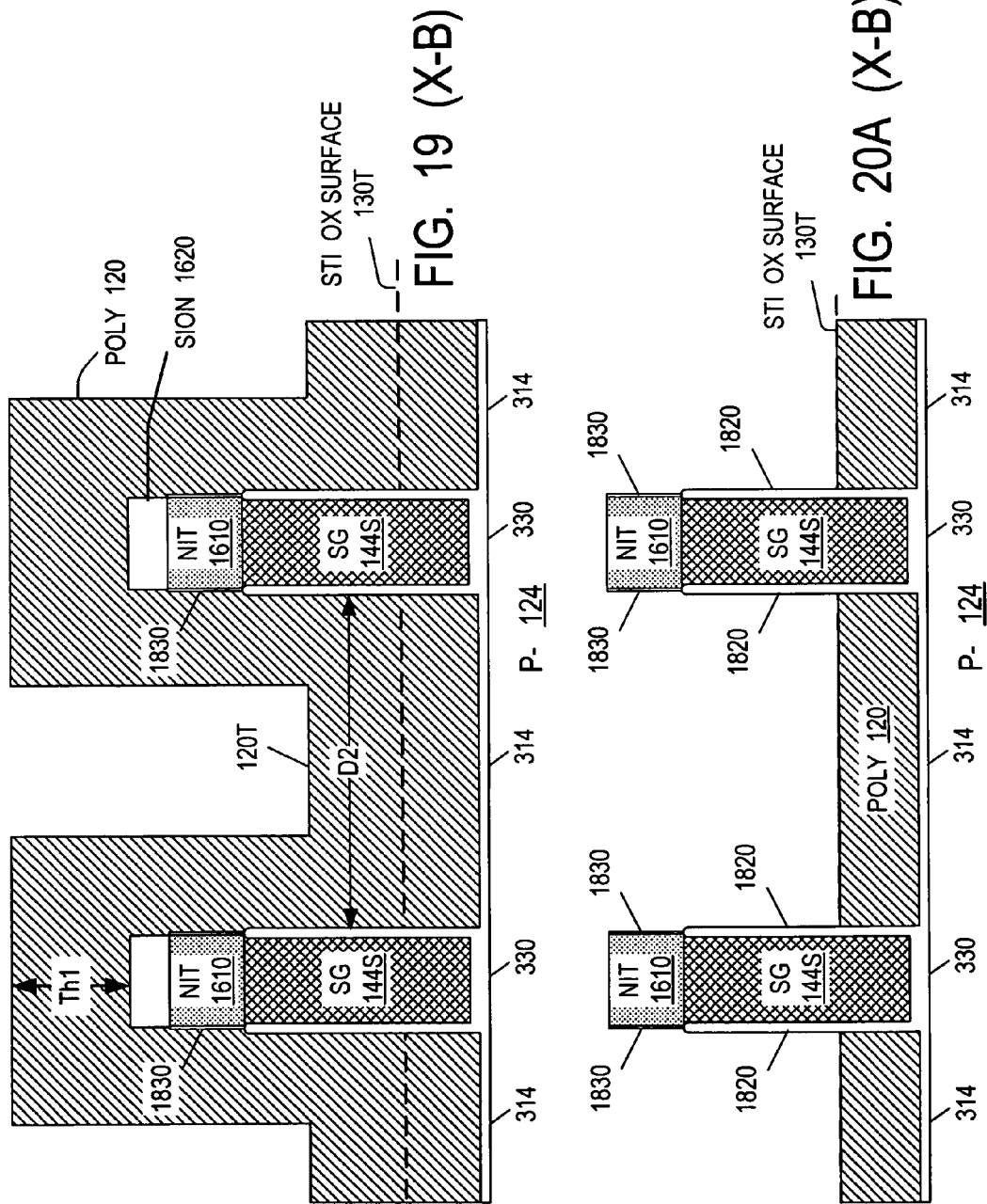

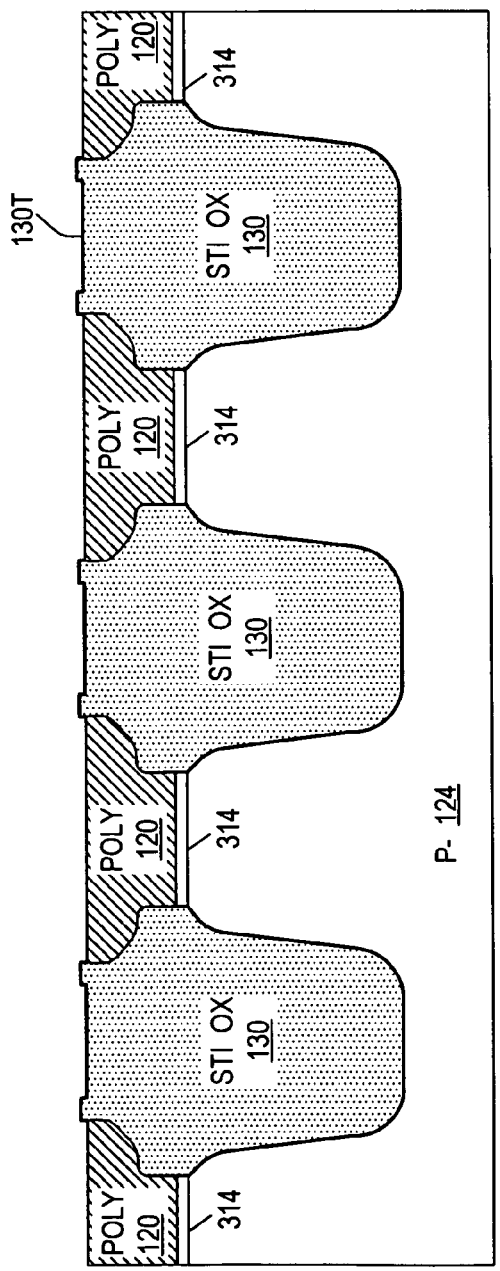
FIG. 20B (Y-D)
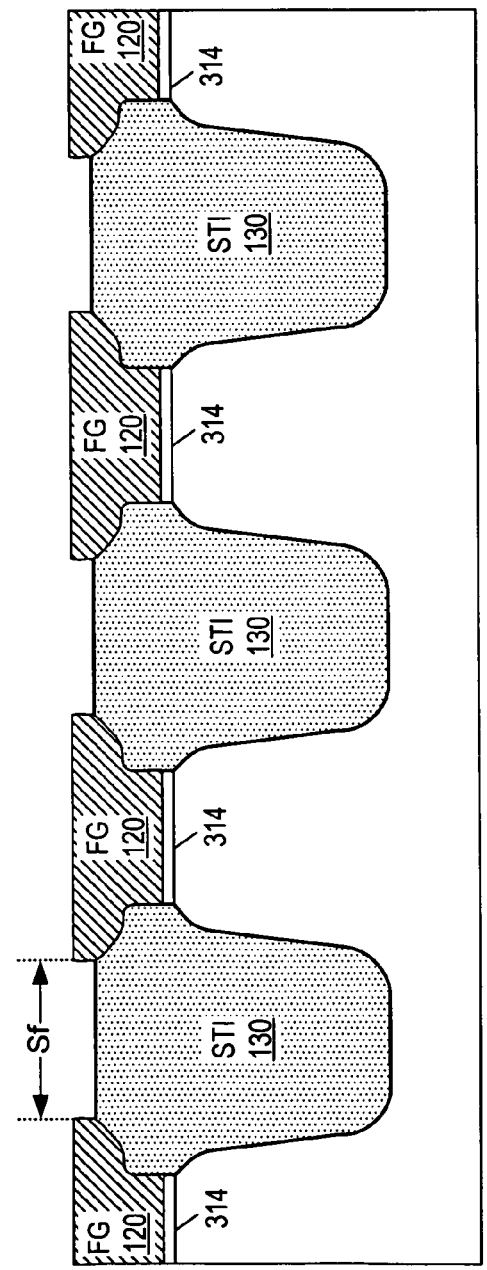
FIG. 21 (Y-D)

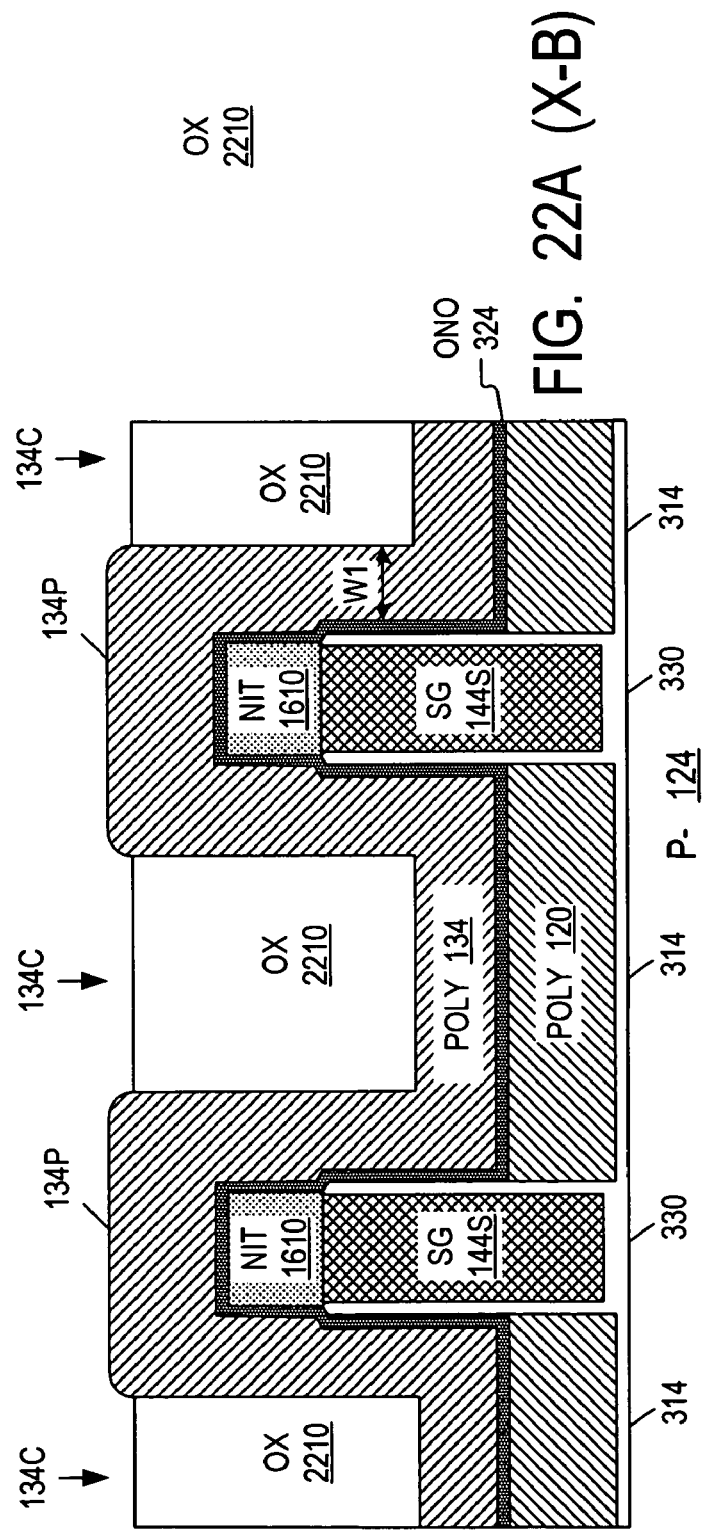
FIG. 22A (X-B)

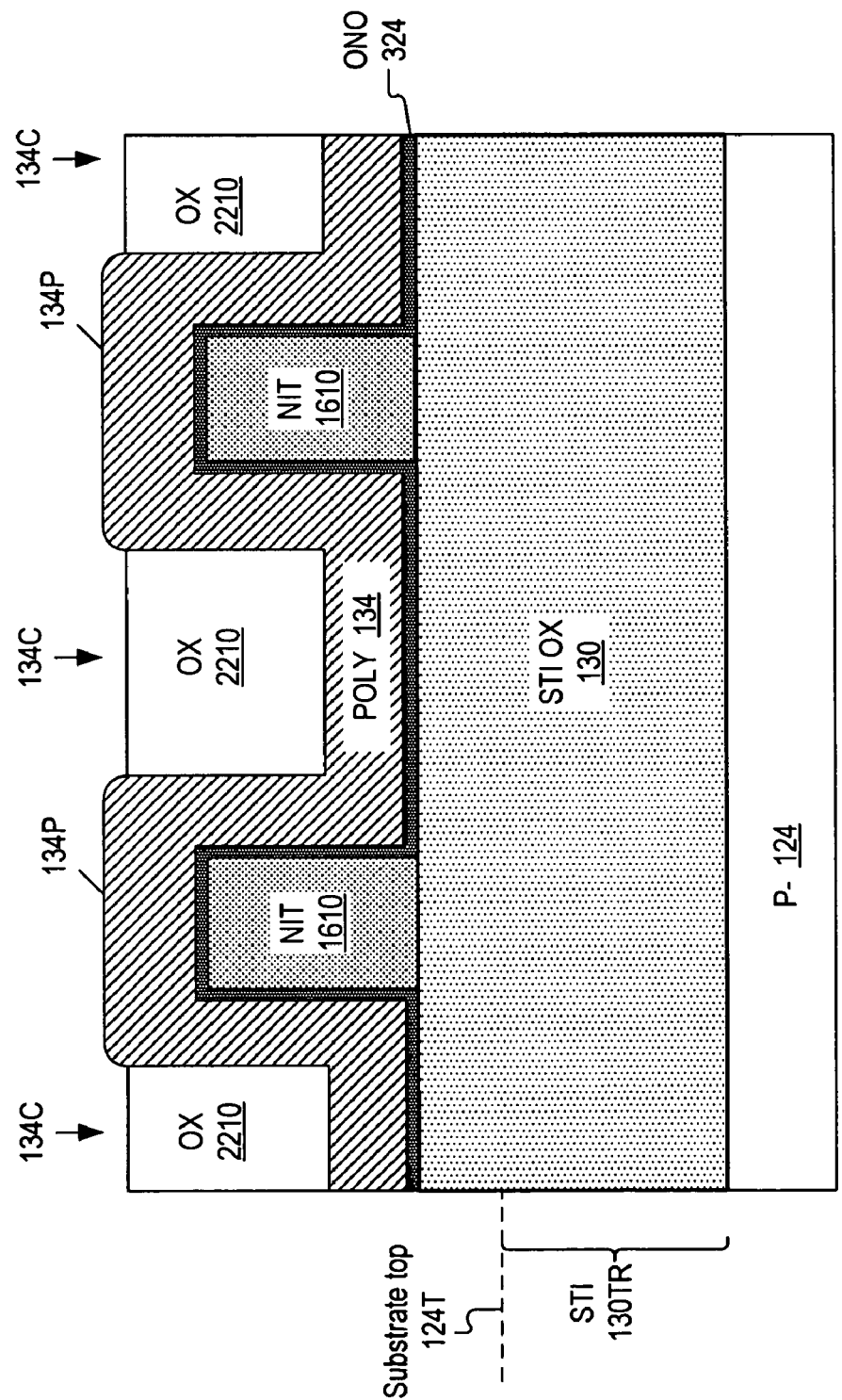
FIG. 22B (X-E)

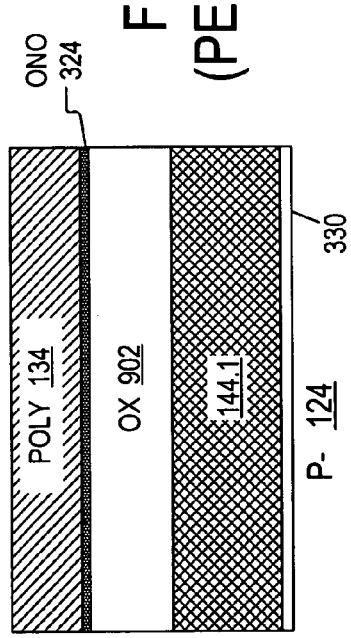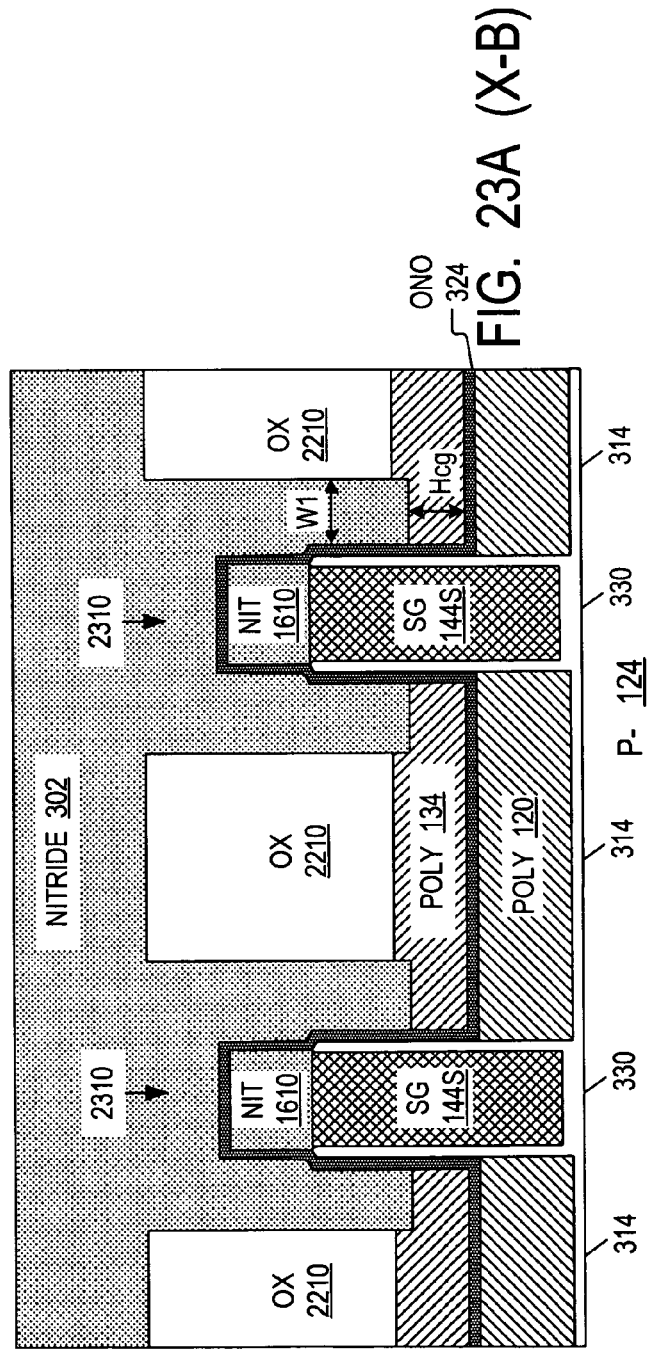

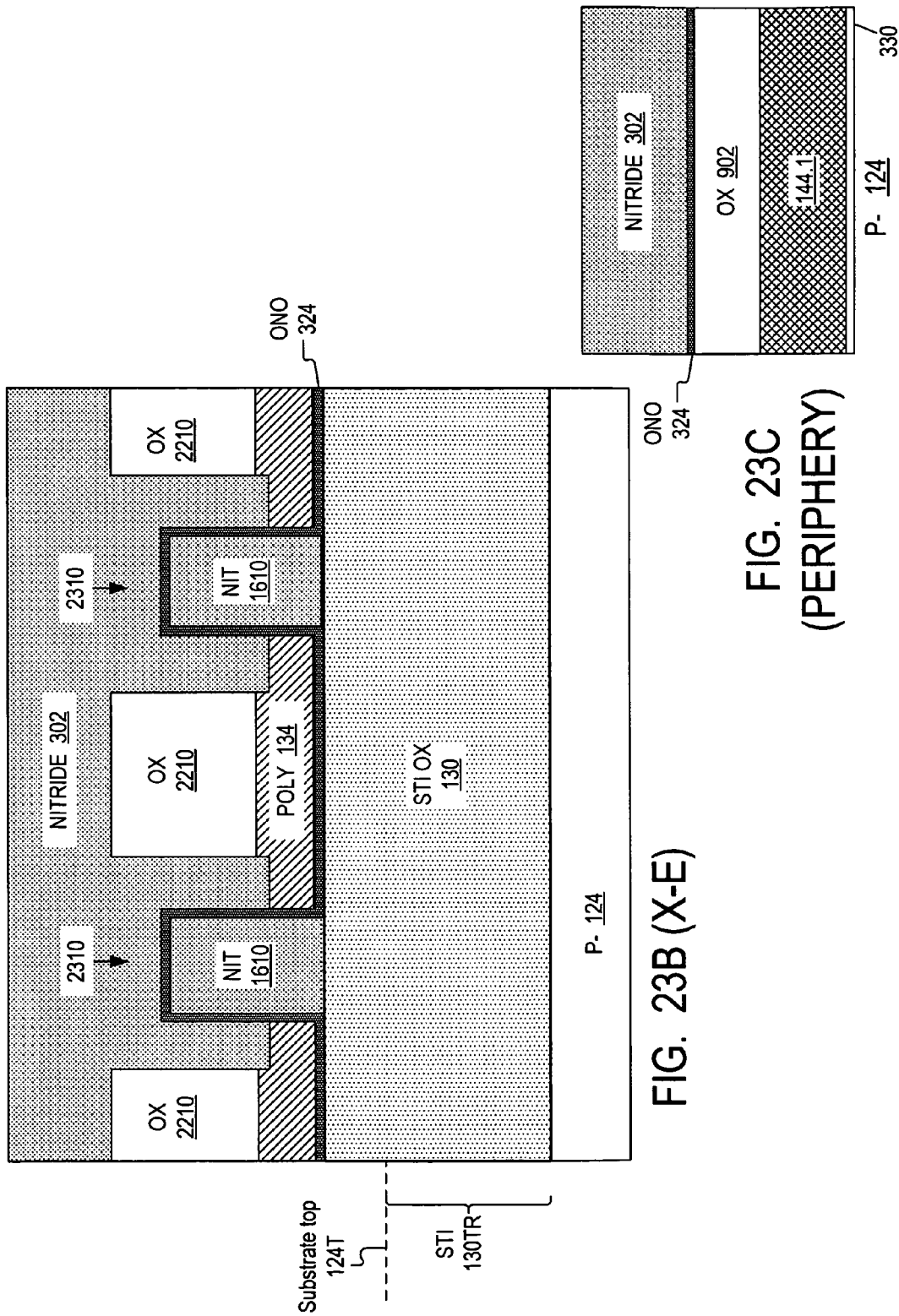

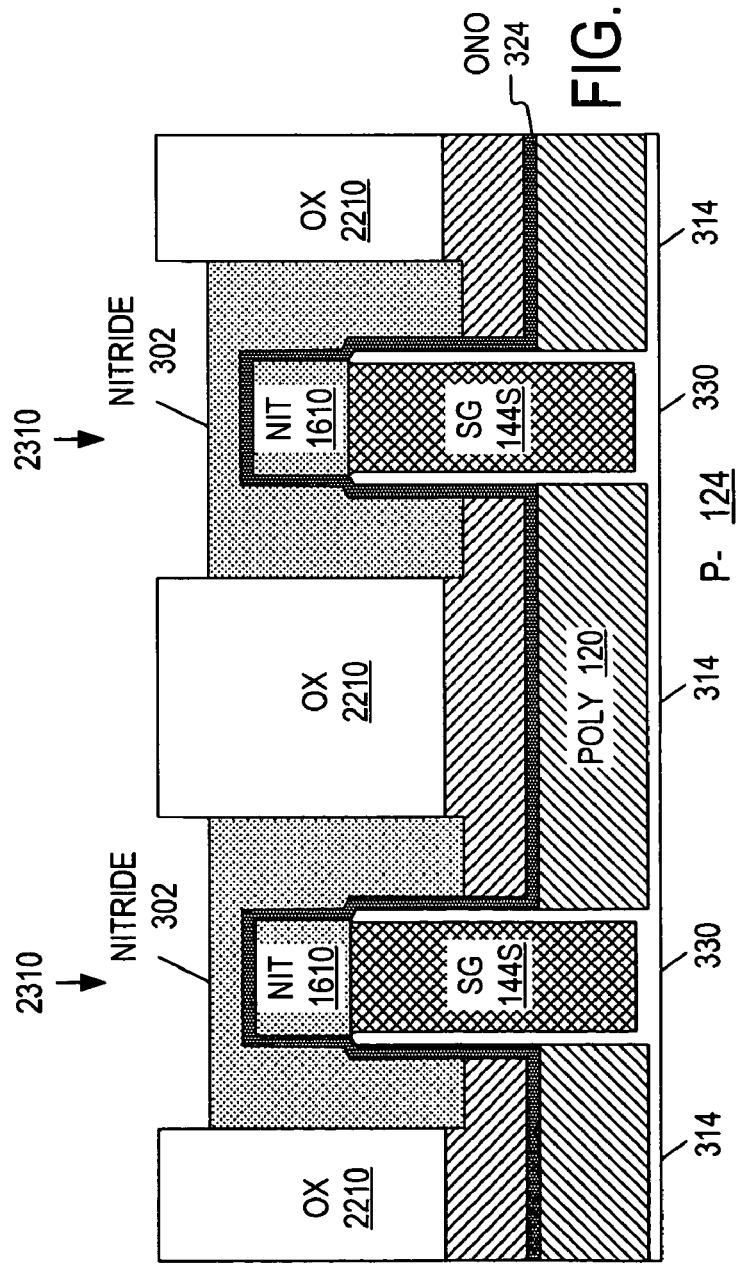
FIG. 24A (X-B)

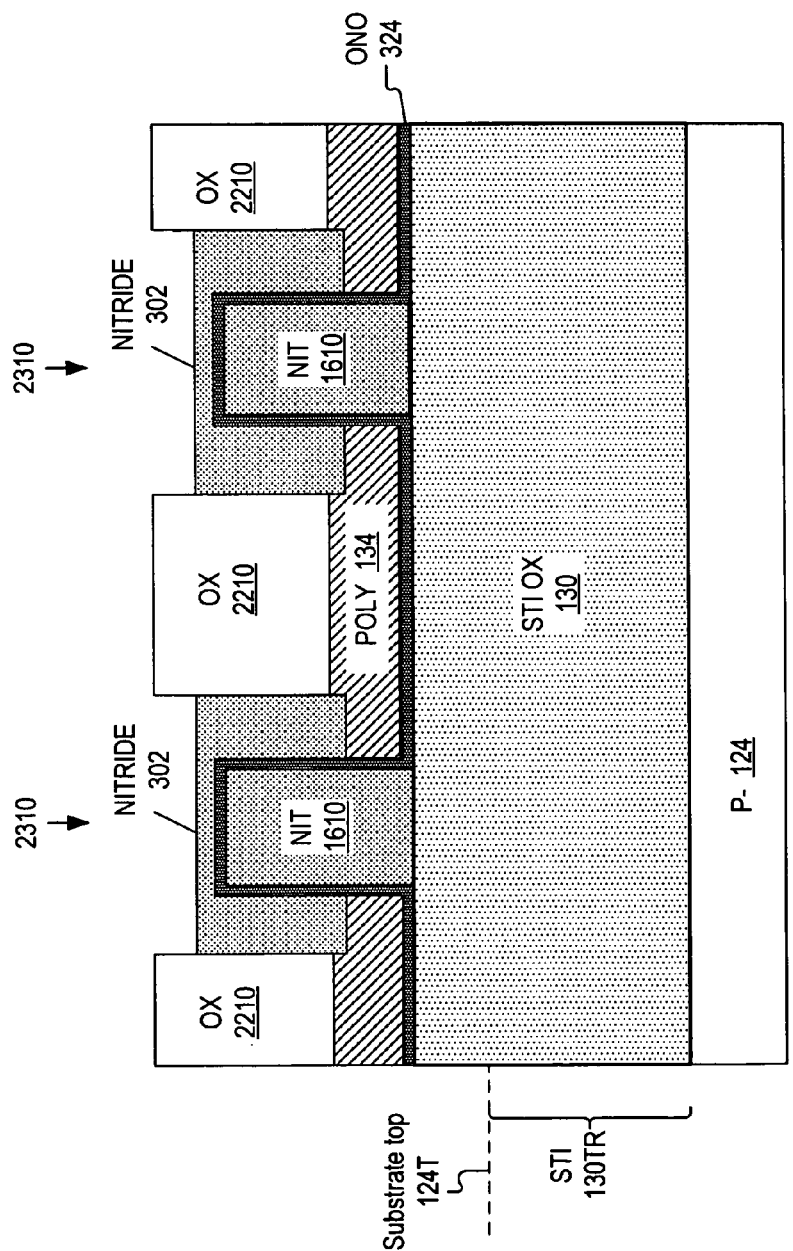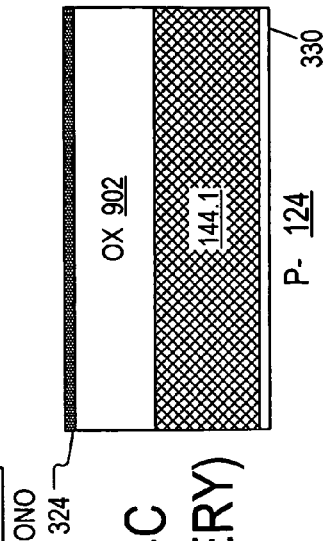
FIG. 24B (X-E)
FIG. 24C (PERIPHERY)

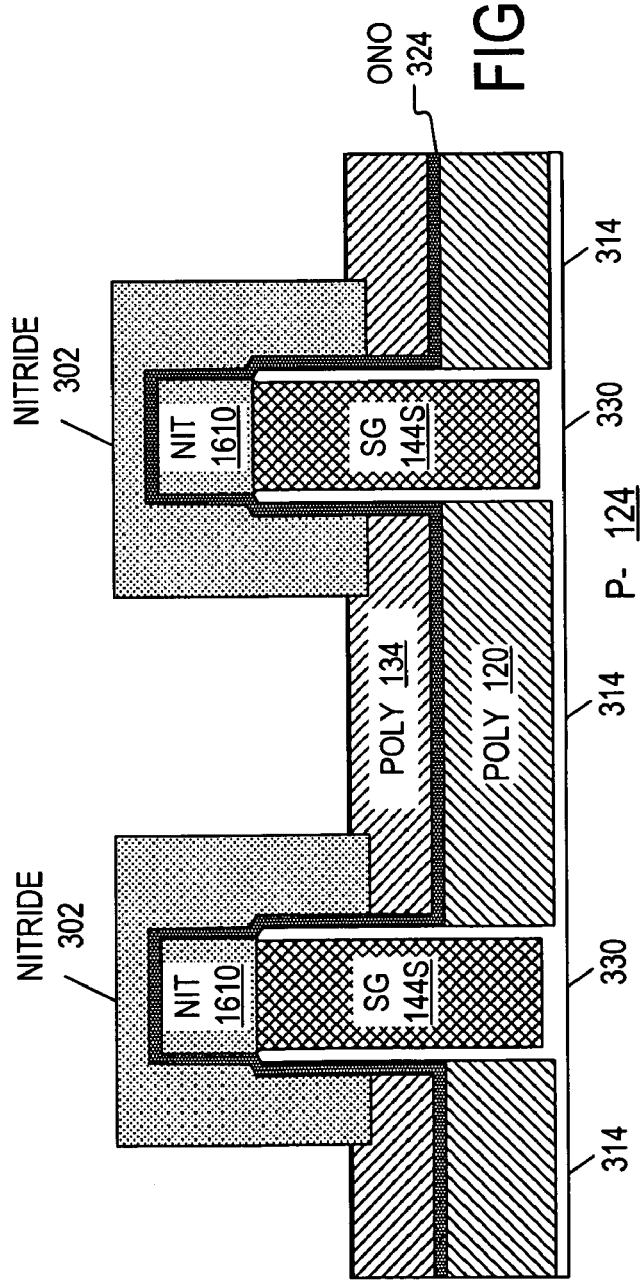
FIG. 25A (X-B)

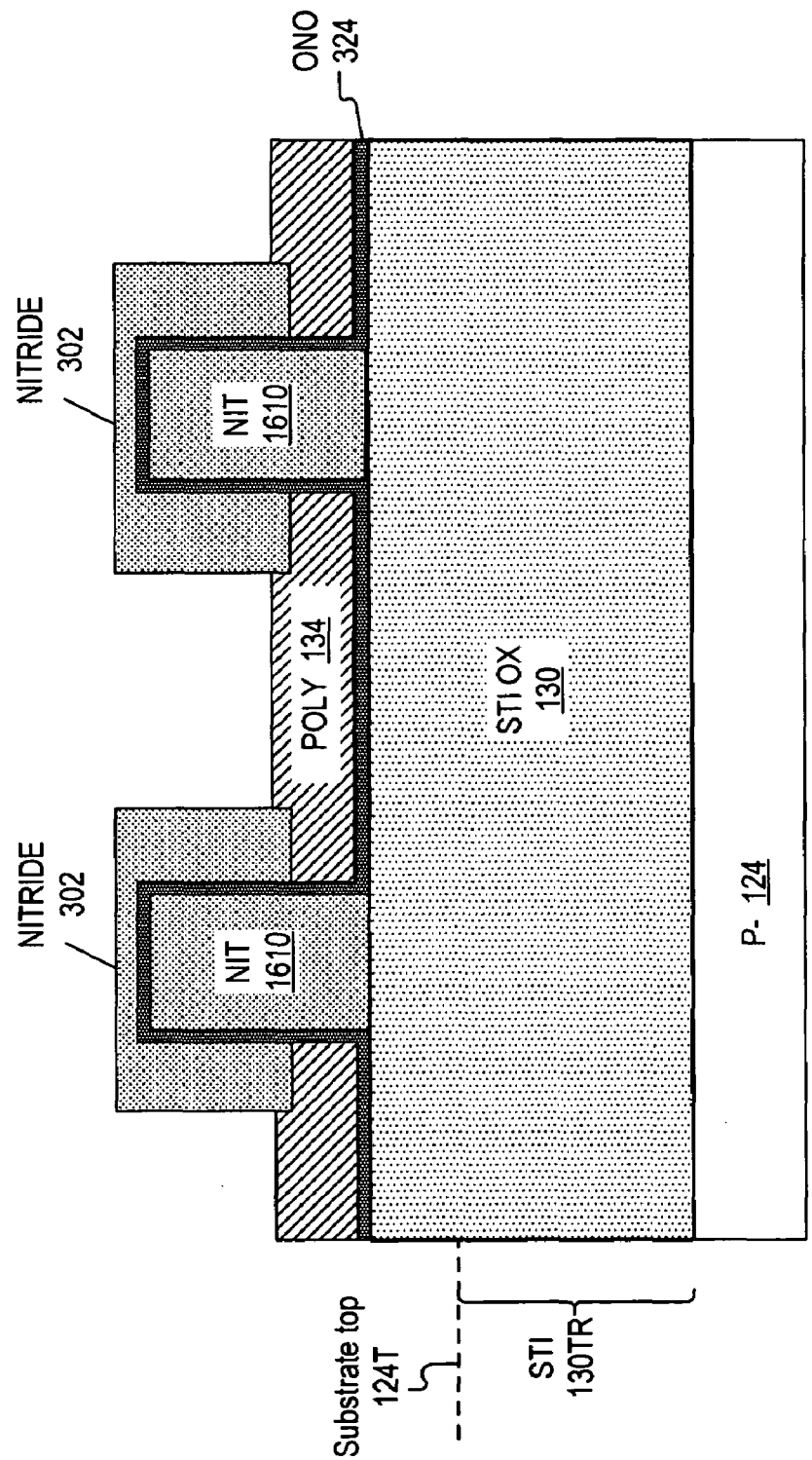
FIG. 25B (X-E)

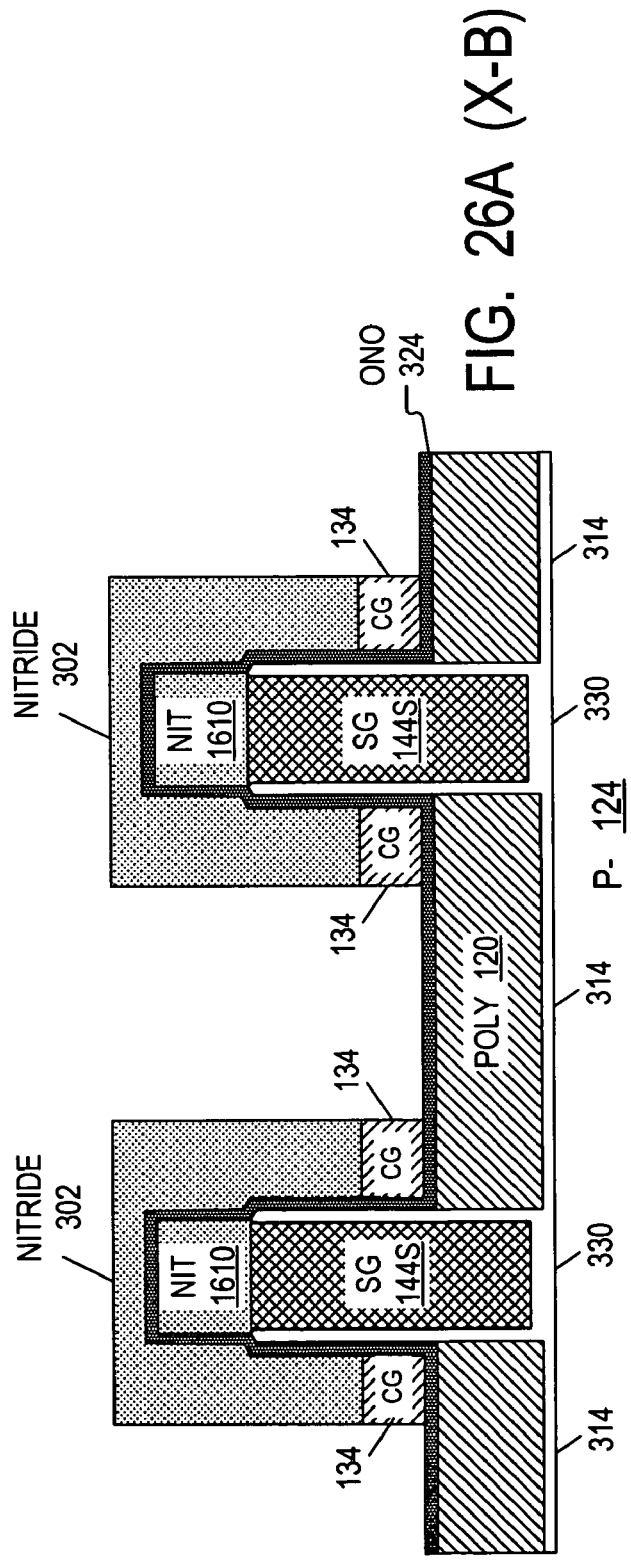
FIG. 26A (X-B)

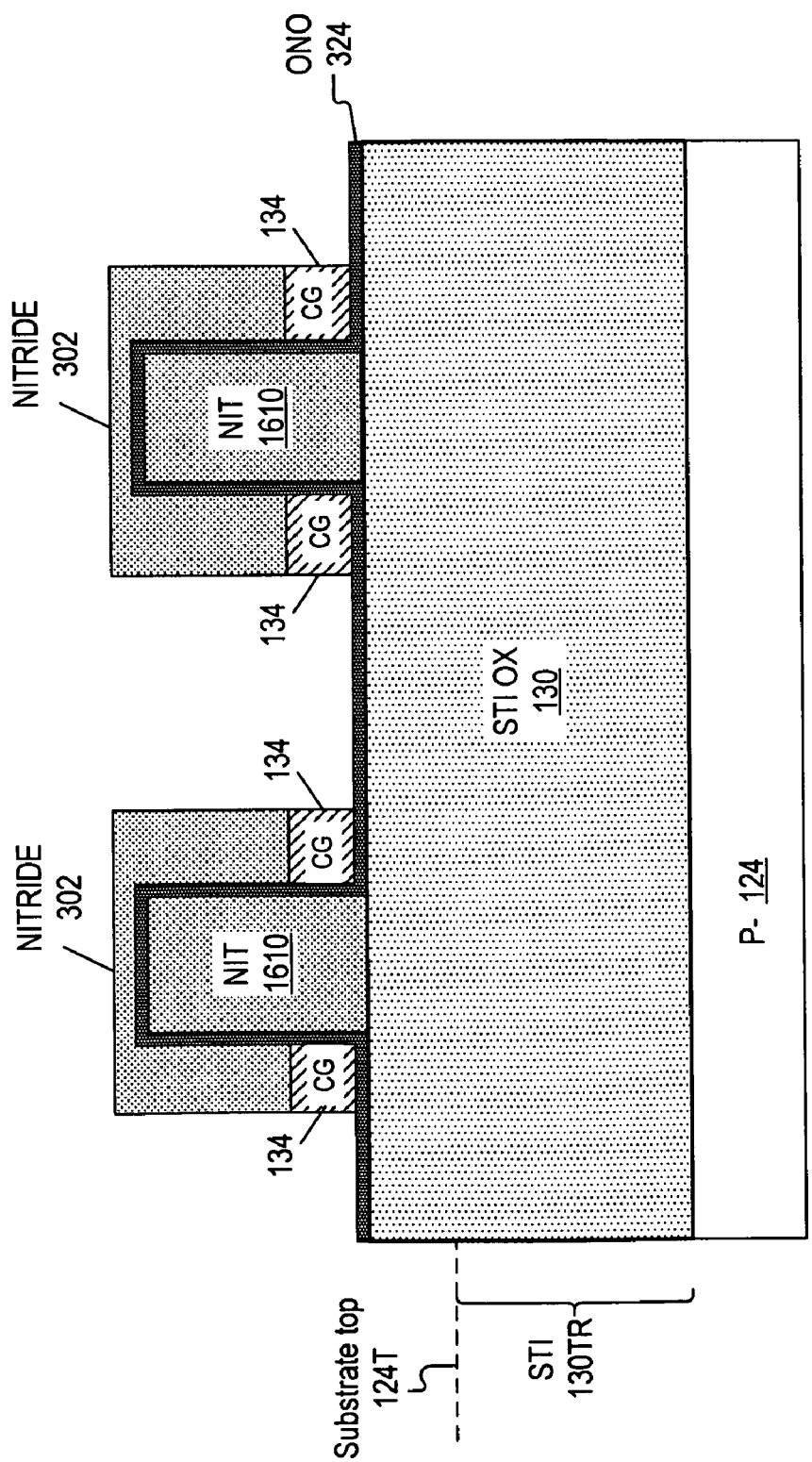
FIG. 26B (X-E)

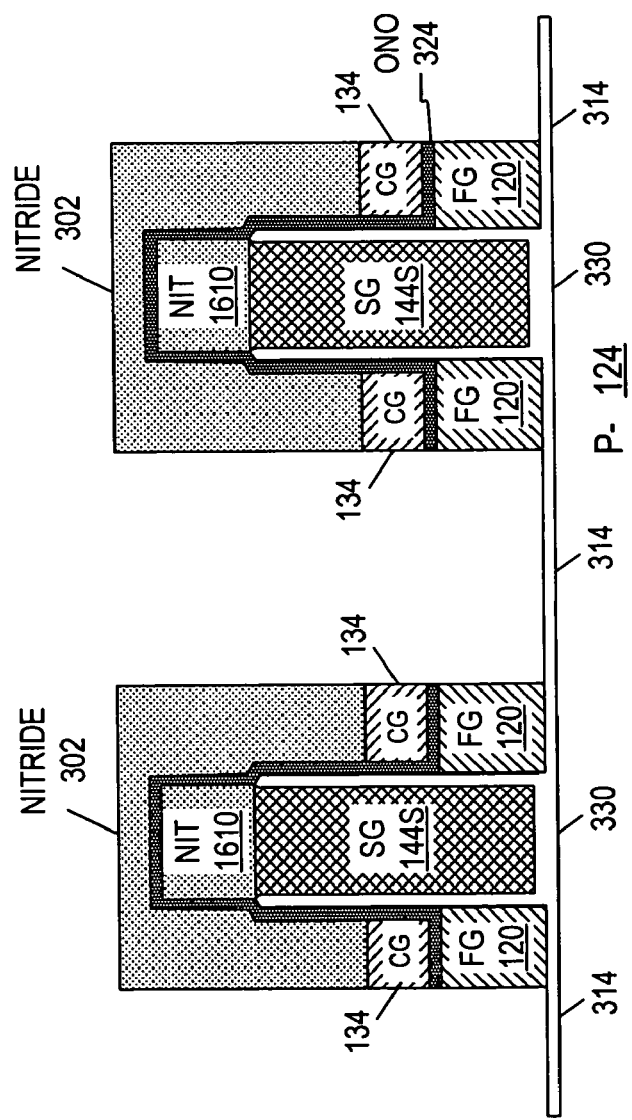

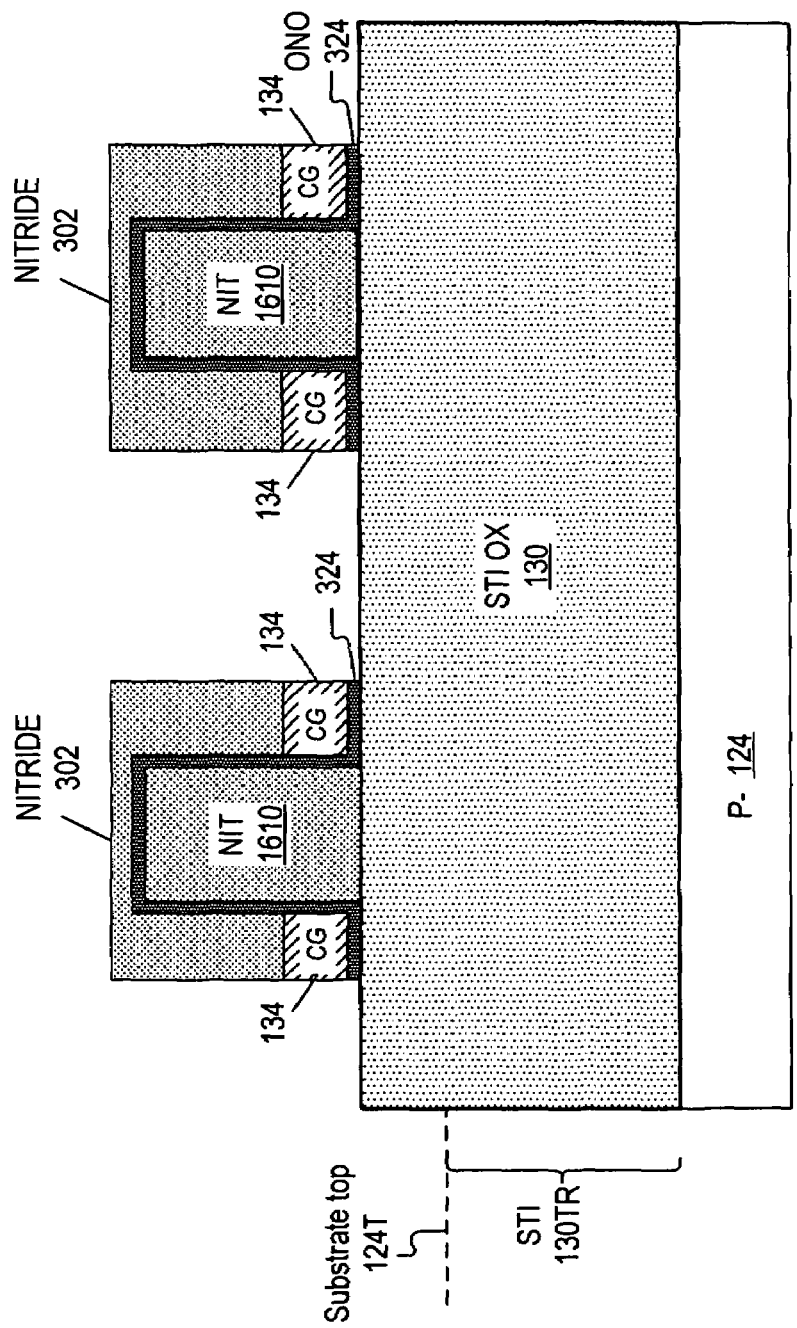

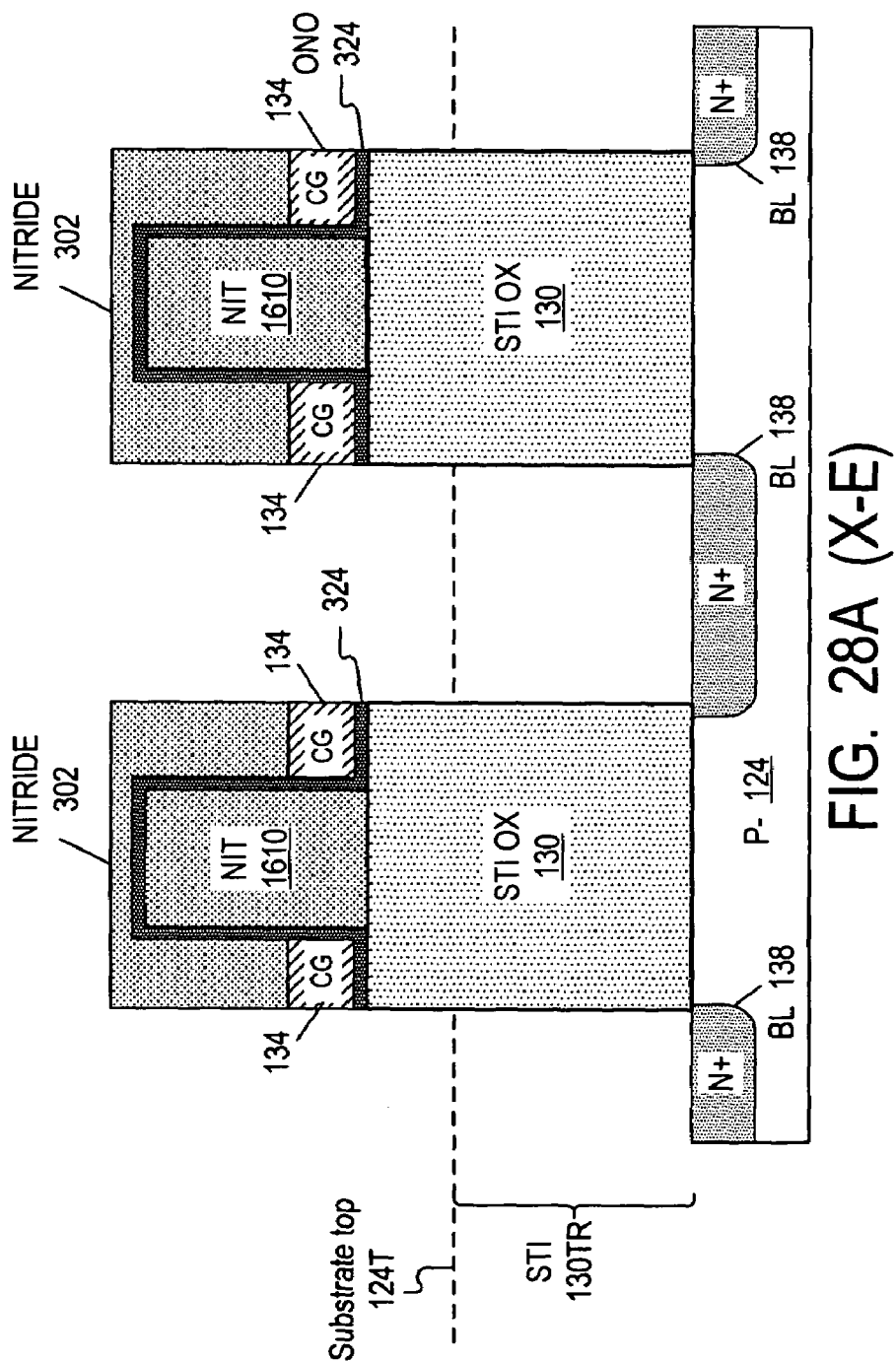

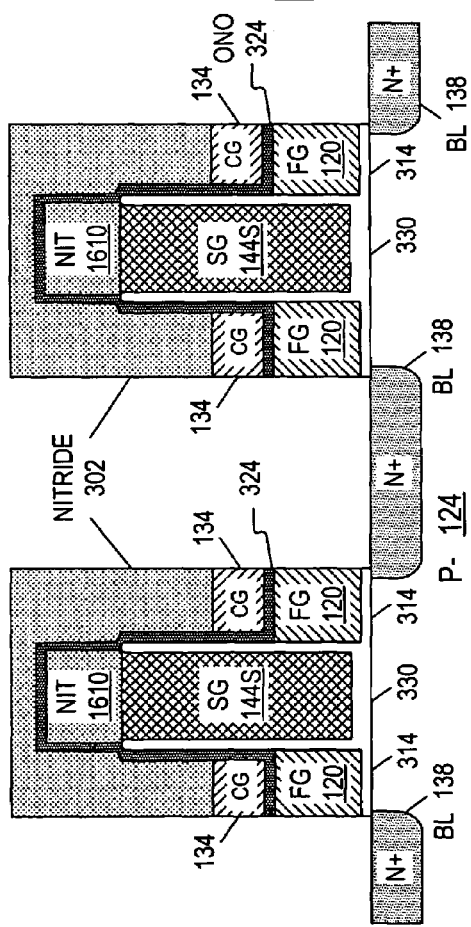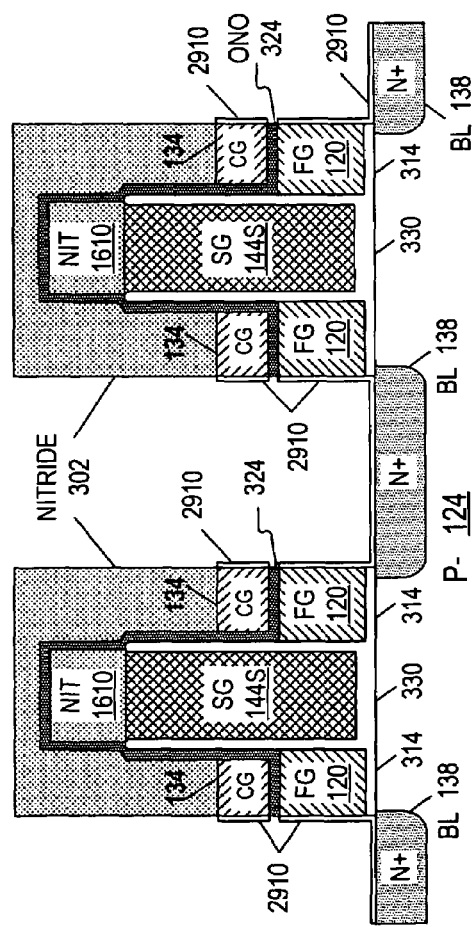

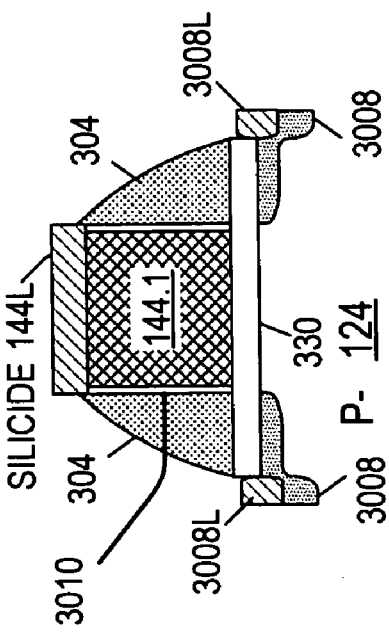
FIG. 31 (PERIPHERY)
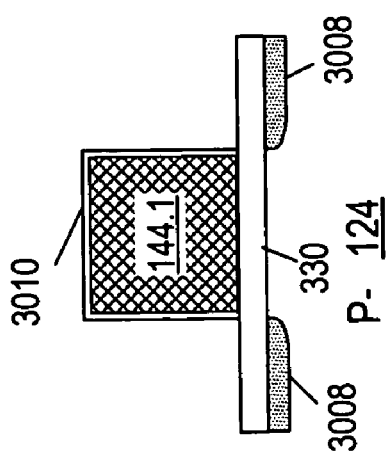
FIG. 30 (PERIPHERY)

FABRICATION OF CONDUCTIVE LINES INTERCONNECTING FIRST CONDUCTIVE GATES IN NONVOLATILE MEMORIES HAVING SECOND CONDUCTIVE GATES PROVIDED BY CONDUCTIVE GATE LINES, WHEREIN THE ADJACENT CONDUCTIVE GATE LINES FOR THE ADJACENT COLUMNS ARE SPACED FROM EACH OTHER, AND NON-VOLATILE MEMORY STRUCTURES

BACKGROUND OF THE INVENTION

The present invention relates to integrated circuits, and more particularly to nonvolatile memories.

FIG. 1 illustrates an electrically erasable programmable read-only memory array (EEPROM) described in U.S. Pat. No. 6,420,231 issued Jul. 16, 2002 to Harari et al. and incorporated herein by reference. FIG. 2 is a circuit diagram of the array. Each memory cell 110 has two conductive floating gates 120 positioned side by side in the X direction (row direction) over planar top surface 124T of silicon substrate 124. The floating gates are insulated from the substrate. In the Y direction (column direction), the adjacent floating gates are separated by field oxide regions 130. The floating gates are formed from the first polysilicon layer.

Steering gates 134 are formed from the second polysilicon layer and are insulated from the floating gates. Each steering gate extends in the Y direction between two columns of memory cells 110 and overlies two adjacent columns of floating gates 120. Bitlines 138 are diffusion regions in substrate 124. Each bitline 138 runs in the Y direction between two adjacent columns of floating gates 120. In each row, a bitline 138 provides two source/drain regions to respective two adjacent memory cells 110.

Wordlines 144, formed from the third polysilicon layer, overlie the steering gates and extend in the X direction. Wordlines 144 may also be formed from polycide. The wordline layer also provides select gates 144S (FIG. 1) for the memory cells.

Metal strap lines (not shown) reduce the resistance of the polysilicon elements and diffusion elements of the array.

The memory operates as follows. Each cell 110 can be represented as having two floating gate transistors 110L, 110R (FIG. 2) separated by a select gate transistor 110S (a transistor with gate 144S). The floating gate of transistor 110L is selected for reading or programming by placing a sufficient voltage on the steering gate 134 above the floating gate of transistor 110R to turn on the transistor 110R regardless of the charge on its floating gate. Likewise, the floating gate of transistor 110R is selected for reading or programming by placing a sufficient voltage on the steering gate 134 above the floating gate of transistor 110L to turn on the transistor 110L regardless of the charge on its floating gate. Each floating gate can be read by providing a voltage difference between the respective bitlines 138 and sensing the state of one of the bitlines. A negative charge can be written to a floating gate by source side hot electron injection. The floating gates can be erased through wordlines 144 or substrate 124. See U.S. Pat. No. 6,266,278 issued Jul. 24, 2001 to Harari et al. and incorporated herein by reference.

As noted above, floating gates 120 are made from the first polysilicon layer, steering gates 134 are made from the second polysilicon layer, and wordlines 144 are made from the third polysilicon layer or a polycide layer which also provides the select gates 144S. Alternative fabrication techniques are desirable.

SUMMARY

This section summarizes some features of the invention. Other features are described in the subsequent sections. The invention is defined by the appended claims which are incorporated into this section by reference.

In some embodiments of the present invention, select gates 144S are formed from a different layer than wordlines 144. In some embodiments, this fabrication method provides additional control over the spacing between the wordlines 144 and steering gates 134. Increased spacing is desirable to reduce the parasitic capacitance between the wordlines and the steering gates.

In some embodiments, select gates 144S are formed before floating gates 120 and before steering gates 134 (the steering gates will also be called "control gates" herein). The control gates are provided by conductive control gate lines. Each control gate line provides control gates for one column of the memory cells. The adjacent control gate lines for the adjacent columns are spaced from each other. See FIGS. 3A–3G illustrating one embodiment described in detail below. In some embodiments, wordlines 144 are formed after the floating and control gates. For example, select gates 144S can be formed from the first polysilicon layer, floating gates 120 from the second polysilicon layer, control gates 134 from the third polysilicon layer, and wordlines 144 from a metal layer. The gate dielectric for select gates 144S can be formed by thermal oxidation before the formation of the floating gates. Therefore, the floating gates are not affected (not oxidized) by the select gate oxide growth. Also, in some embodiments, the select gate dielectric has the same thickness as the gate dielectric of high voltage peripheral transistors, so the same gate dielectric layer can be used both for select gates 144S and the high voltage peripheral transistors. See U.S. patent application Ser. No. 10/440,508 filed May 16, 2003 and Ser. No. 10/632,154 filed Jul. 30, 2003, both incorporated herein by reference.

In addition, if the select gates 144S are formed before the floating gates, the gate dielectric for floating gates 120 can be the same layer as the dielectric formed on the select gate sidewalls to insulate the select gates from the floating and control gates. See U.S. patent application Ser. No. 10/440,005 filed May 16, 2003 and Ser. No. 10/631,452 filed Jul. 30, 2003, both incorporated herein by reference.

In some embodiments of the present invention, the floating gates are fabricated in a self-aligned manner using an isotropic etch of the floating gate layer.

Other features and advantages of the invention are described below. The invention is defined by the appended claims.

BRIEF DESCRIPTION OF THE DRAWINGS

FIGS. 3B, 3C, 3D, 3E show vertical cross sections of the array of FIG. 3A.

FIGS. 4–7, 8A, 8B, 9–12, 13A, 13B, 14A, 14B, 15A show vertical cross sections of memory structures in the process of fabrication according to one embodiment of the present invention.

FIGS. 15C, 16A, 16B, 16C show vertical cross sections of memory structures in the process of fabrication according to one embodiment of the present invention.

FIGS. 17B, 17C, 18A, 18B, 18C, 19, 20A, 20B, 21, 22A, 22B, 22C, 23A, 23B, 23C, 24A, 24B, 24C, 25A, 25B, 26A, 26B, 27A, 27B, 28A, 28B, 29, 30, 31 show vertical cross sections of memory structures in the process of fabrication according to one embodiment of the present invention.

DESCRIPTION OF SOME EMBODIMENTS

The embodiments described in this section illustrate but do not limit the invention. The invention is not limited to particular materials, process steps, or dimensions. The invention is defined by the appended claims.

Figure 3A:
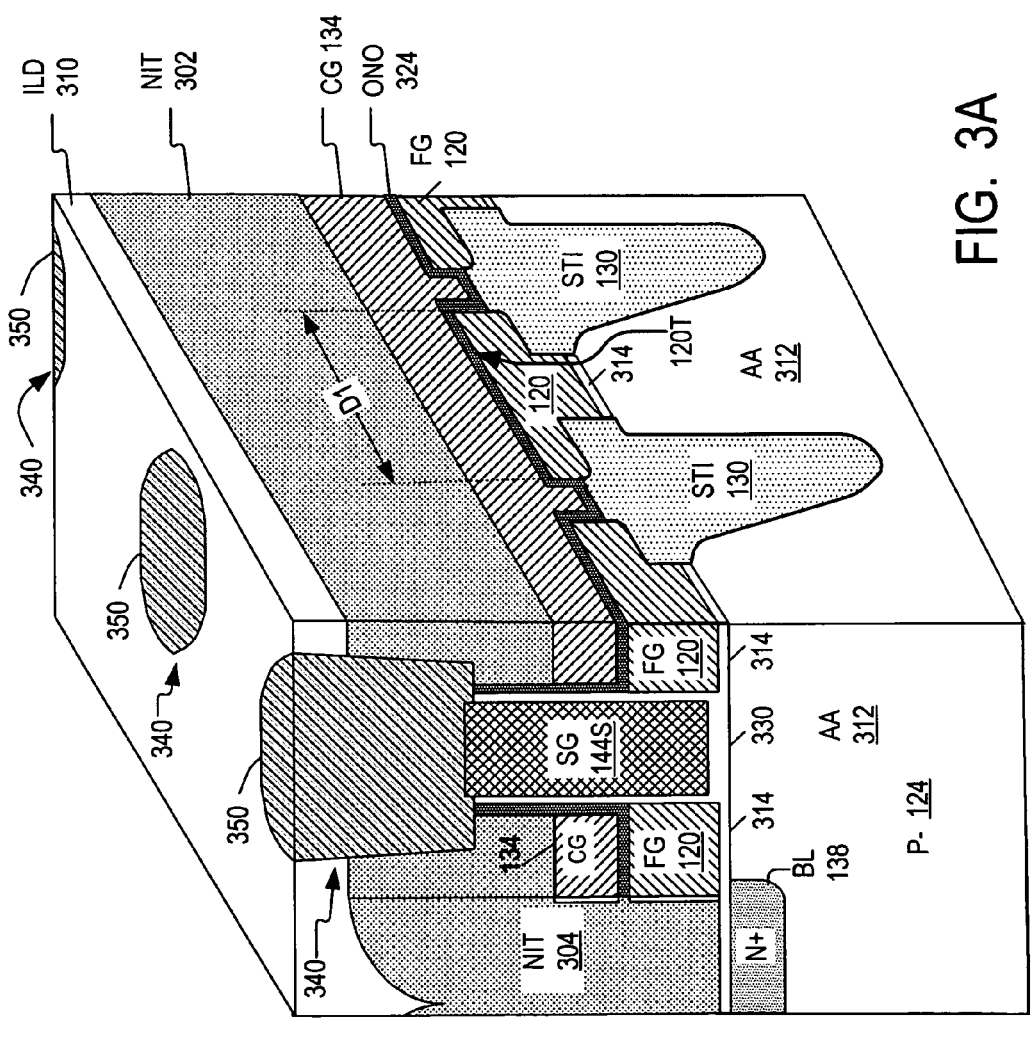
FIG. 3A is a perspective view of a memory array according to one embodiment of the present invention.
Figure 3B:
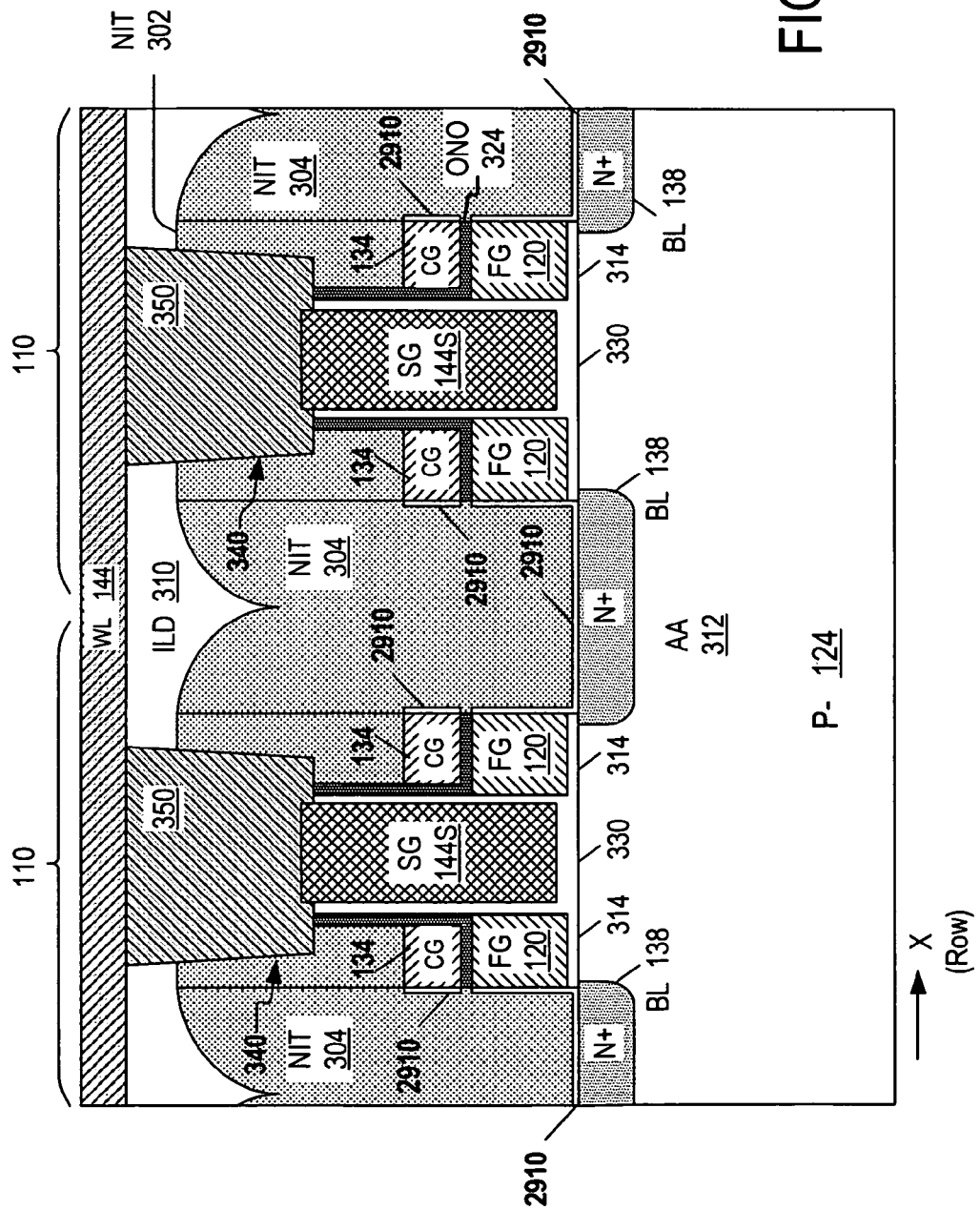
Figure 3C:
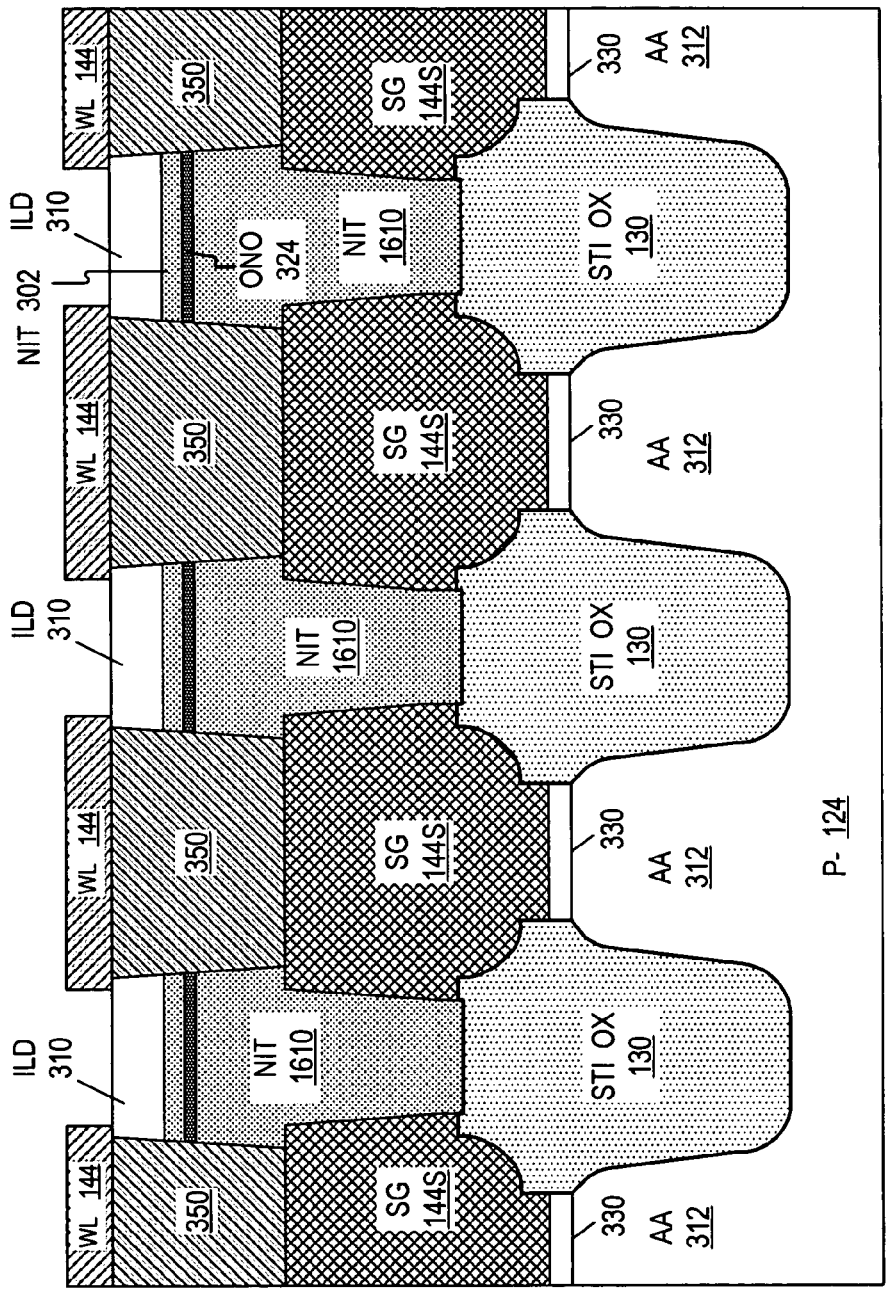
Figure 3E:
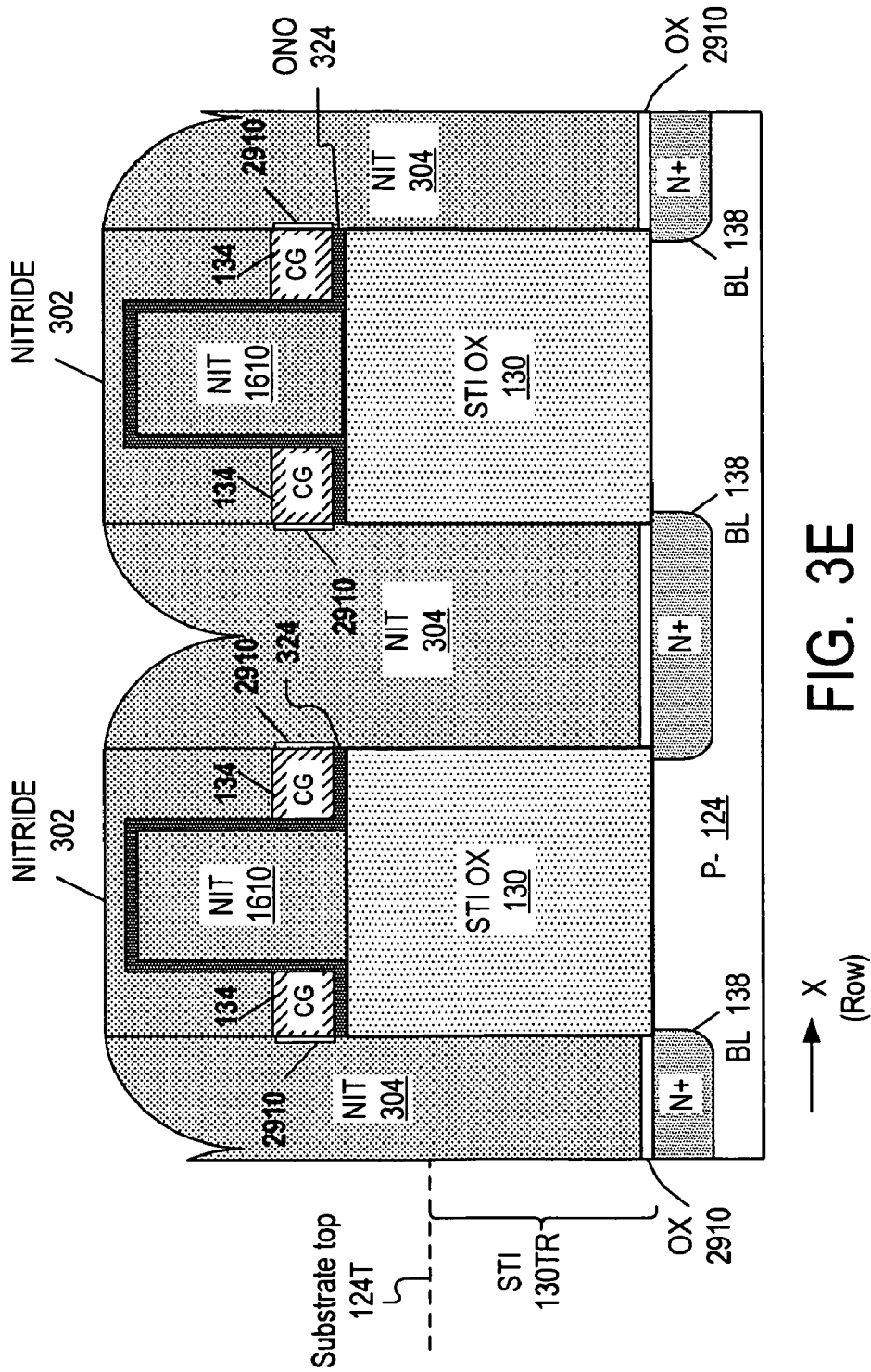
Figure 3F:
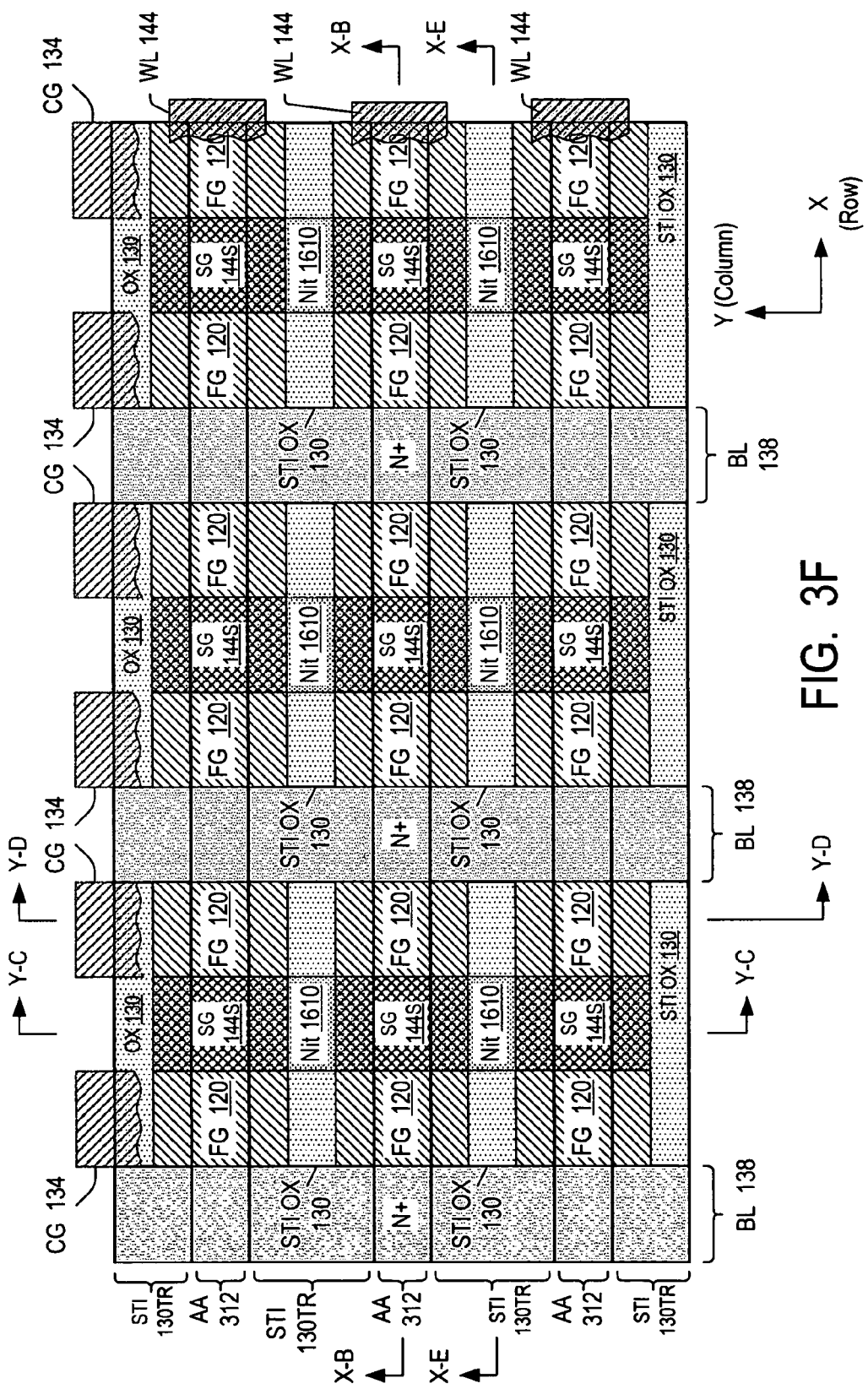
FIG. 3F is a top view of the array of FIG. 3A.
Figure 3G:
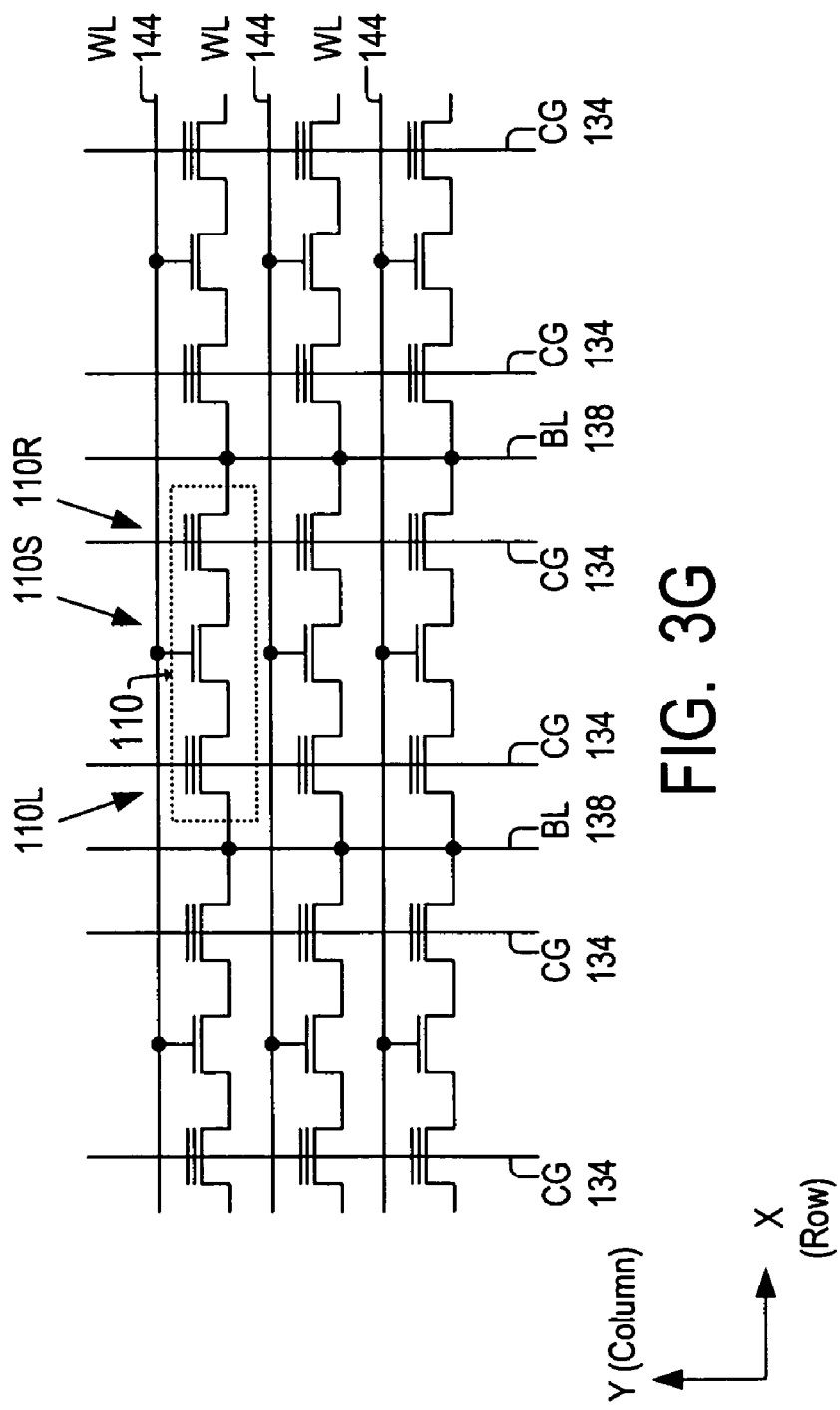
FIG. 3G is a circuit diagram of the array of FIG. 3A.

FIGS. 3A–3F are different views of a nonvolatile memory array according to one embodiment of the present invention. FIG. 3A is a perspective view. FIG. 3F is a top view. FIGS. 3B, 3C, 3D, 3E show vertical cross sections marked in FIG. 3F as X-B, Y-C, Y-D, and X-E respectively. The cross section X-B runs in the X direction (row direction) through floating gates 120 and the active areas between field dielectric regions 130. The cross section Y-C runs in the Y (column) direction through select gates 144S. The cross section Y-D runs in the Y direction through floating gates 120. The cross section X-E runs in the X direction through oxide regions 130 between select gates 144S. FIG. 3G is a circuit diagram of the array.

Figure 1:
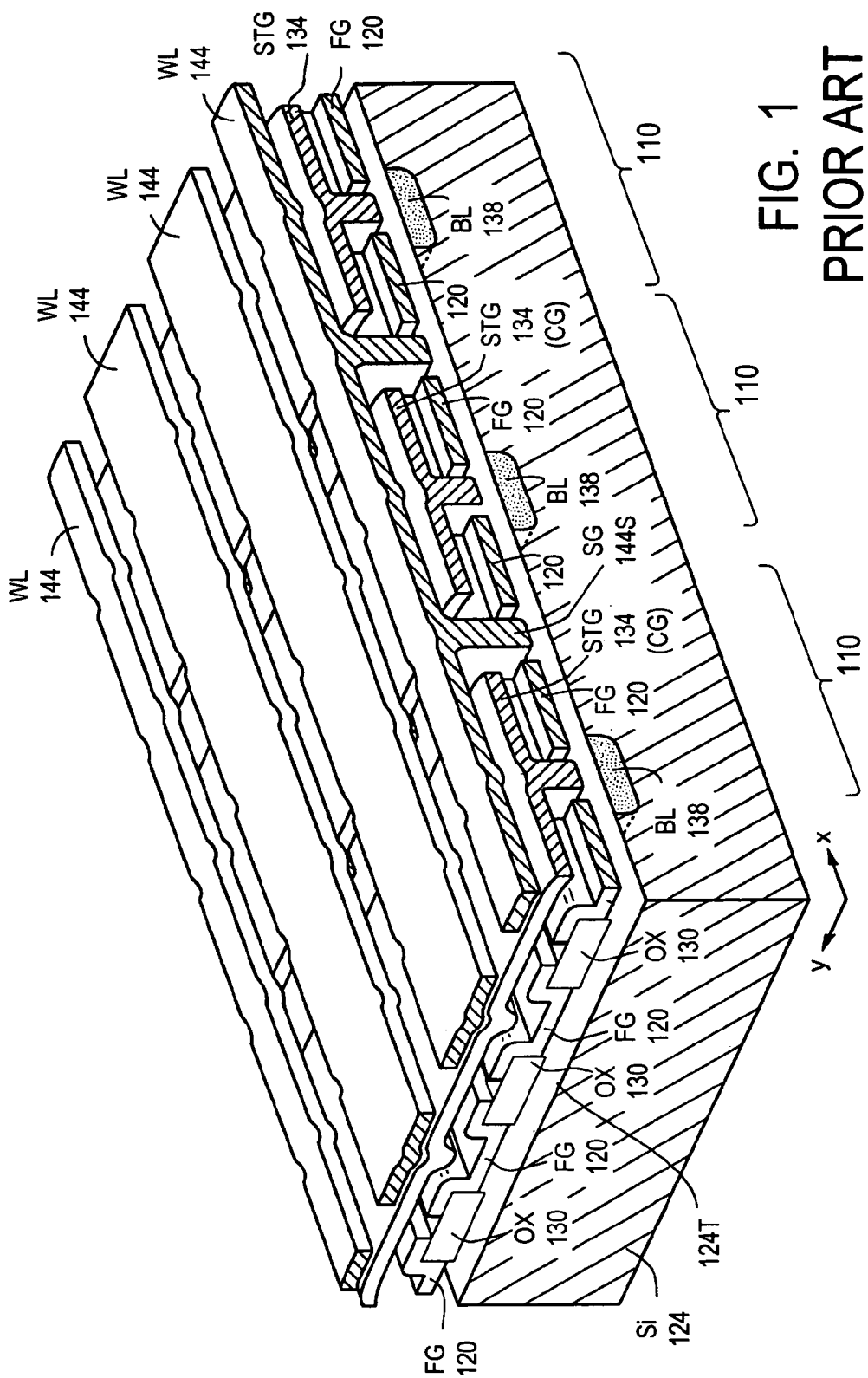
FIG. 1 is a perspective view of a prior art memory array.
Figure 2:
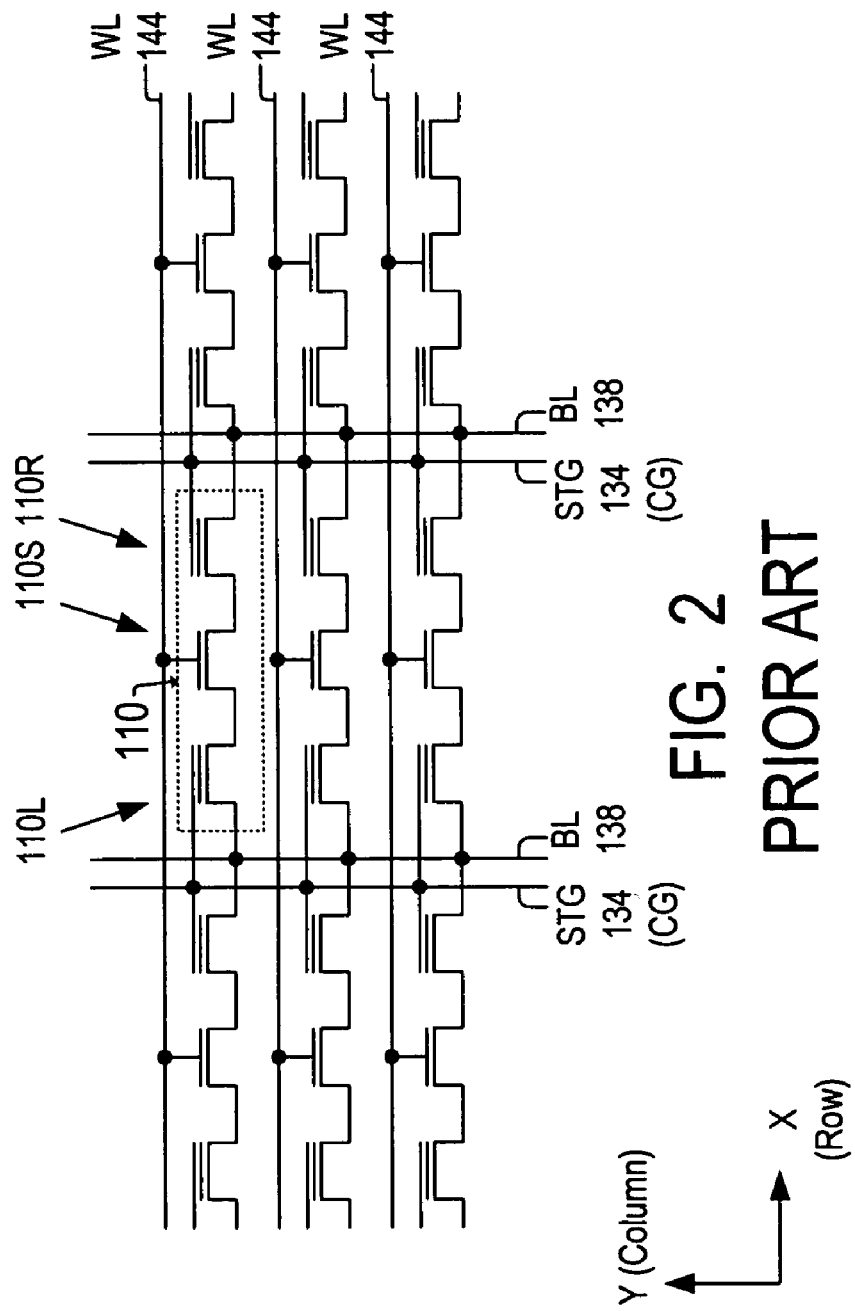
FIG. 2 is a circuit diagram of the array of FIG. 1.

The circuit diagram of FIG. 3G is similar to that of FIG. 2 but each control gate line 134 provides the control gates to one column of the memory cells, and the adjacent control gate lines are spaced from each other. As in FIG. 1, each memory cell has two conductive floating gates 120 positioned side by side in the X direction over the planar top surface of active areas 312 of silicon substrate 124. The floating gates are insulated from the substrate by dielectric 314. In the Y direction, the adjacent floating gates are separated by field oxide regions (substrate isolation regions) 130. In this embodiment, the substrate isolation is STI type (shallow trench isolation). Oxide 130 is formed in trenches 130TR. Each trench 130TR runs through the whole array, but oxide 130 is etched out of the trenches at the location of bit lines 138 (note FIG. 3E showing a cross section along a trench 130TR). Oxide 130 protrudes upward above the top surface 124T of substrate 124.

The invention is not limited to STI. For example, the oxide 130 structure of FIG. 1 can also be used.

In FIGS. 3A–3F, control gates 134 overlie floating gates 120, and are insulated from the floating gates and from select gates 144S by ONO 324. ONO 324 (oxide/nitride/oxide) is a sandwich of silicon dioxide, silicon nitride, silicon dioxide. Each control gate line 134 extends in the Y direction and overlies one column of floating gates 120. The adjacent control gate lines are spaced from each other. Bitlines 138 are diffusion regions in substrate 124. Each bitline 138 runs in the Y direction between two adjacent columns of floating gates 120, traversing the trenches 130TR. In each row except the first and the last rows of the array, a bitline 138 provides two source/drain regions to two adjacent memory cells.

In each memory cell, a channel region in the active area of substrate 124 extends between the two adjacent bitlines. The channel region includes two channel areas underlying two respective floating gates 120 and a channel area underlying the select gate 144S of the cell.

In this embodiment, control gates 134 are doped polysilicon, but polycides and other conductive materials can also be used.

Conductive select gates 144S are insulated from substrate 124 by dielectric 330. In this embodiment, select gates 144S are doped polysilicon, but they may be made of polycides or other conductive materials. Each select gate 144S may overlap the adjacent STI trenches 130TR (FIGS. 3C, 3F), but each gate 144S does not extend to the adjacent memory cells. The wordlines 144 (e.g. metal) are formed from a separate layer. Before that layer is deposited, dielectric layers 302, 304, 310 are formed over the structure. The combined thickness of layers 302, 310 and the combined thickness of layers 304, 310 can be large to reduce the capacitance between the wordlines 144 and the underlying memory features (including the floating and control gates). In some embodiments, dielectric 302 is 1000–1500 Å thick, dielectric 304 is 200–400 Å thick, and dielectric 310 is 2000–5000 Å thick, and larger thickness values can be used. Contact openings 340 are etched in ILD 310 to select gates 144S. The openings are filled with metal 350. Metal 350 may be part of wordline layer 144, or may be a separate layer (e.g. tungsten plugs).

The term "control gate" may apply to a control gate of a single memory cell or to a line 134 running through the array.

Exemplary operating voltages are shown in Table 1 below. The voltages are in volts. The reading and programming operations are performed as in the memory of FIG. 1. The programming is by channel hot electron injection (CHIE). The erase is through substrate 124 (Fowler-Nordheim tunneling through dielectric 314). The sign "~" indicates a voltage range. For example "1~2" means 1 V to 2 V.

TABLE 1

| | | Read | Program (CHEI) | Erase |
|---|---|---|---|---|
| WL 144 (Row) | Selected | 2.5 | 1.5 | 1~2 |
| | Unselected | 0 | 0 | 0 |
| CG 134 | Selected Selected bit Column (L or R) | 1.5~2 | 9~10 | −9~−10 |
| | Unselected bit (R or L) | 6~7 | 6~7 | |
| | Unselected Column | 0 | 0 | |
| BL 138 | Selected Selected bit (L or R) | 1~1.5 | 4.5~5 | Floating |
| | Column Unselected bit (R or L) | 0 | 0 | |
| | Unselected Column | 0 | 0 | |
| Substrate 124 | | 0 | 0 | 7~8 |

The programming can also be done by Fowler-Nordheim tunneling.

In one embodiment, the memory is fabricated as follows. The memory array is fabricated in a doped region of type P-formed in monocrystalline silicon substrate 124. This region can be isolated by P-N junctions (not shown). See e.g. U.S. Pat. No. 6,355,524 issued Mar. 12, 2002 to H. T. Tuan et al. and incorporated herein by reference.

STI trenches 130TR can be formed, for example, by a process described in U.S. patent application Ser. No. 10/678, 317 U.S. filed Oct. 3, 2003 by Yi Ding and incorporated herein by reference. More particularly, as shown in FIG. 4, silicon dioxide 410 (pad oxide) is formed on substrate 124 by thermal oxidation or some other technique to an exemplary thickness of 150 Å. The dimensions, and the voltages in Table 1, are given for an exemplary process using a 0.18 µm line width technology (the line width is the minimal dimension that can be reliably printed photolithographically). The fabrication method is believed to be scalable to smaller line widths (e.g. 90 nm or even smaller), and the invention is not limited to a particular line width. FIG. 4 shows a Y cross section, i.e. a cross section in the Y direction. All the Y cross sections are identical at this stage.

Silicon nitride 420 is deposited on oxide 410. In one embodiment, the thickness of nitride 420 is in the range of 2000 Å to 2200 Å. Nitride 420 is patterned photolithographically, using a photoresist mask (not shown), to define trenches 130TR and active areas 312. Oxide 410 and substrate 124 are etched through the openings in nitride 420. Trenches 130TR ("STI trenches") are formed as a result. An exemplary depth of trenches 130TR is 0.2 µm, measured from the top surface of the substrate 124. Other depths are possible.

Nitride 420 is subjected to a wet etch to recess the vertical edges of the nitride layer away from trenches 130TR. See FIG. 5 (Y cross section). This step reduces the aspect ratio of the holes that will be filled with dielectric 130. As will be seen below, the etch of nitride 420 will also reduce the capacitance between the floating gates and the substrate 124, thus increasing the gate coupling ratio.

A thin layer 130.1 of silicon dioxide is thermally grown on the exposed silicon surfaces to round the edges of trenches 130TR and passivate the trench surfaces. Silicon dioxide 130.2 (FIG. 6, cross section Y) is deposited by a high density plasma process (HDP) or by non-plasma low pressure chemical vapor deposition (LPCVD). Oxide 130.2 fills the trenches and initially covers the nitride 420. Oxide 130.2 is polished by CMP (chemical mechanical polishing). The CMP stops on nitride 420. A planar top surface is provided.

In some of the figures, the layers 130.1, 130.2 are shown as a single layer 130. This dielectric 130 will be referred to as STI dielectric or field dielectric.

The array area is masked with photoresist (not shown), and oxide 130 is etched to lower the oxide level in the periphery. See FIG. 7 showing the Y cross section of the array and a peripheral cross section. The lower oxide level will increase the peripheral surface planarity, thus facilitating the subsequent fabrication steps. In some embodiments, the top level of oxide 130 is lowered to a level of 200–500 Å above the substrate 124 in the periphery.

The photoresist is removed. Nitride 420 is removed selectively to oxide 130. This can be done by a wet etch (e.g. with phosphoric acid). See FIG. 8A (cross section Y) and FIG. 8B (periphery). Then pad oxide 410 (FIG. 7) is etched away to expose the substrate 124 in the active areas. The oxide etch may remove a small amount of oxide 130.

Silicon dioxide 330 is thermally grown on the exposed areas of substrate 124 to provide gate dielectric for the select gates of the memory array and for the peripheral transistors. The peripheral transistors are used to form sense amplifiers, address decoders, memory I/O buffers, drivers for various memory elements (e.g. bitlines, wordlines, control gates), and possibly other circuitry needed to access the memory array. See e.g. the aforementioned U.S. Pat. Nos. 6,420,234 and 6,266,278. An exemplary thickness of oxide 330 in the array area is 120 Å. Generally, the oxide thickness depends on the maximum voltage that the oxide 330 is designed to sustain during the memory operation.

In the example shown in FIG. 8B, the peripheral area includes a high voltage transistor area 812H and a low voltage transistor area 812L. Oxide 330 is first grown thermally to a thickness of 60 Å over the entire wafer. This oxide is removed from the low voltage area 812L by a masked etch. The wafer is re-oxidized to re-grow silicon dioxide 330 in area 812L to a thickness of 60 Å. The oxide thickness in the memory array area and in high voltage area 812H increases from 60 Å to 120 Å during this step.

Thus, oxide 330 in the array area and oxide 330 in the high voltage peripheral area 812H is formed simultaneously in these two oxidation steps. The oxide 330 in area 812L and the oxide 330 in the array area and area 812H are not formed simultaneously because the oxide 330 in area 812L is formed in the second oxidation step. See U.S. patent application Ser. No. 10/440,508 filed May 16, 2003 by Yi Ding and incorporated herein by reference.

Intrinsic polysilicon 144.1 (FIG. 9, cross section Y and peripheral cross section) is deposited over the wafer. Layer 144.1 will provide portions of select gates 144S and peripheral transistor gates. An exemplary deposition process is LPCVD, and an exemplary thickness is 1000–1400 Å. Polysilicon 144.1 fills the recesses between the STI dielectric regions 130 and covers the whole wafer.

Silicon dioxide 902 is deposited on polysilicon 144.1 to an exemplary thickness of 1200–1500 Å by CVD (TEOS) or some other process.

Figure 10:
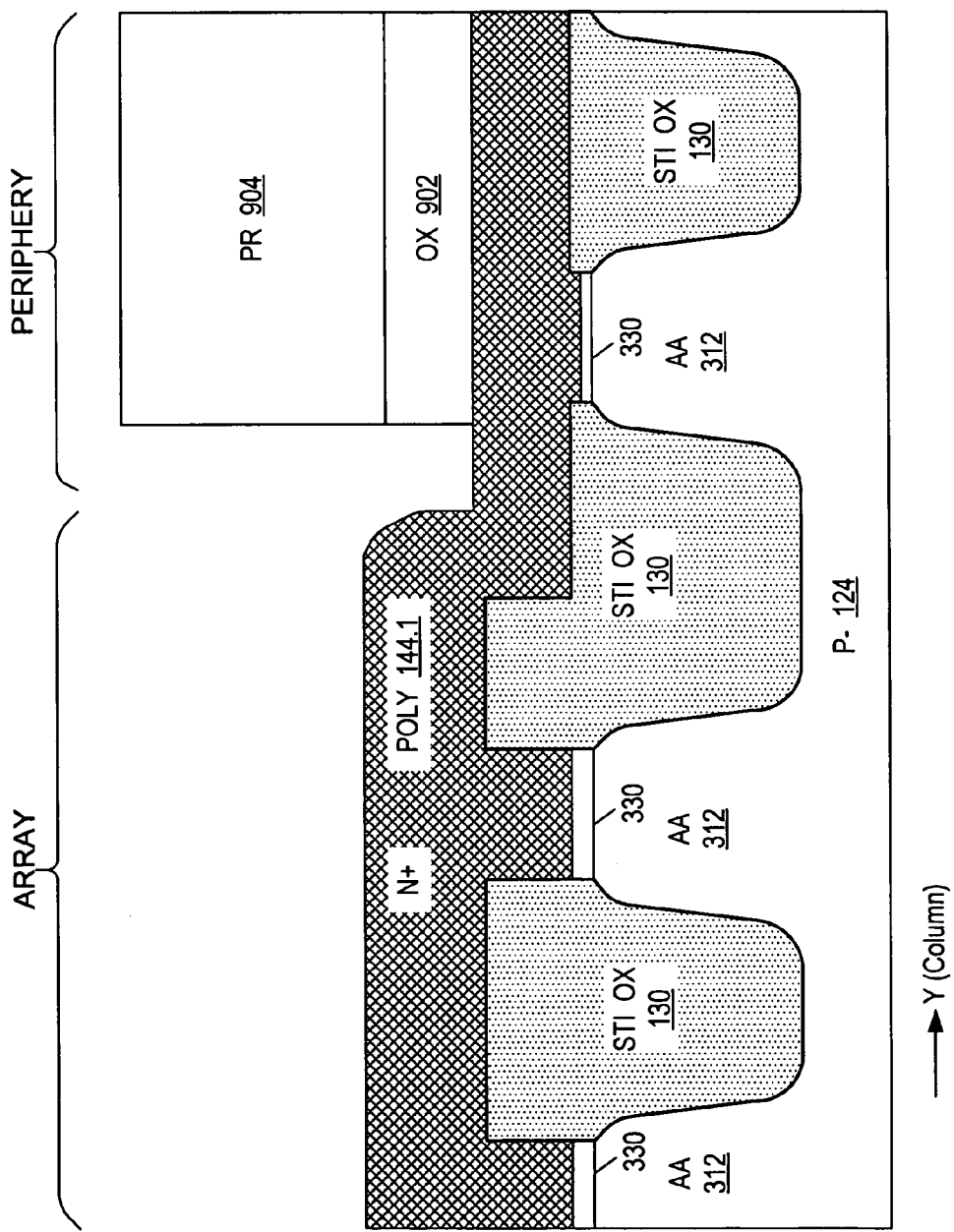

A photoresist mask 904 is formed over the periphery. Oxide 902 is etched away in the array area, and polysilicon 144.1 is doped N+ by ion implantation. See FIG. 10 (cross section Y and peripheral cross section). Alternatively, the doping can be performed before the etch of oxide 902, by ion implantation through the oxide. Resist 904 blocks the dopant from the periphery. Polysilicon 144.1 remains undoped in the periphery, and will be doped later together with the peripheral source/drain regions to create surface channel peripheral transistors. These details are exemplary and not limiting. Non-surface-channel transistors can also be used in the periphery, and further the surface channels transistors can be created by other techniques, known or to be invented.

Polysilicon 144.1 is subjected to a timed dry anisotropic etch to lower its top surface below the top surface of dielectric 130 in the array area. See FIG. 11 (cross section Y and peripheral cross section). Resist 904 protects the periphery during this etch.

Figure 12:
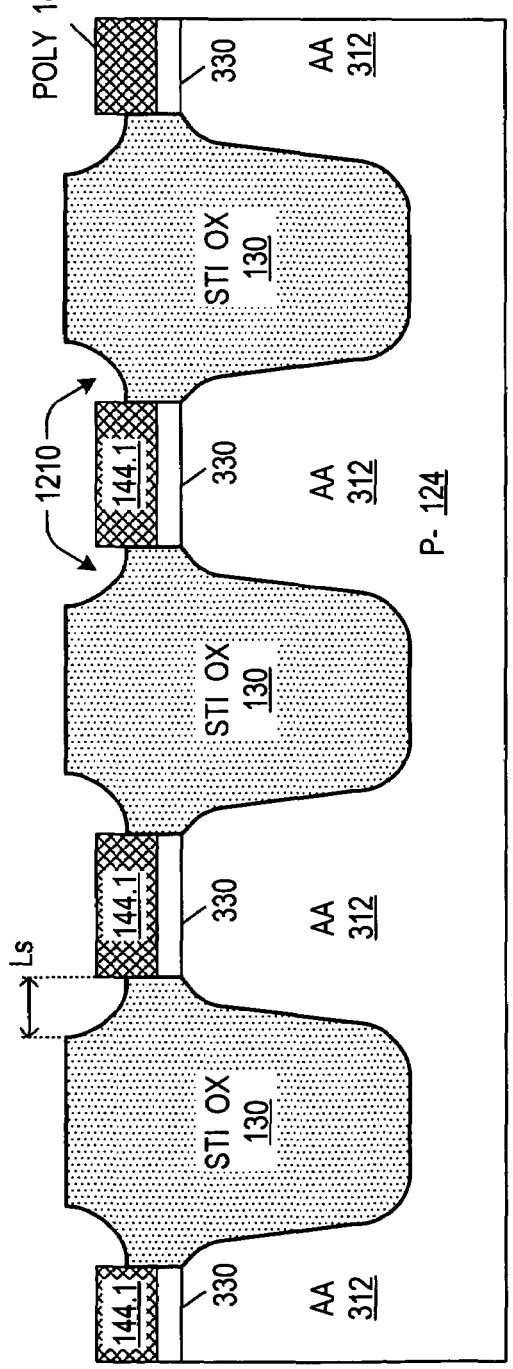

Oxide 130 is etched selectively to polysilicon 144.1 (FIG. 12, cross section Y). The etch includes a lateral component that causes the sidewalls of oxide 130 to be laterally recessed in the direction away from the adjacent polysilicon features 144.1 and active areas 312. This can be an isotropic wet etch. In one embodiment, the isotropic etch laterally recesses the sidewall by an amount Ls in the range of 0.04 µm to 0.05 µm. The etch also lowers the top surface of oxide 130 by the same amount. In addition, the etch attacks the oxide portions near the polysilicon 144.1 to form pockets 1210 in which the top surface of oxide 130 is below the top surface of polysilicon 144.1. Between the pockets 1210, the top surface of oxide 130 is shown to be above the top surface of polysilicon 144.1, but this is not necessary. The top surface of oxide 130 between the pockets 1210 may be even with, or below, the top surface of polysilicon 410.1. See U.S. patent application Ser. No. 10/678,317 filed Oct. 3, 2003 by Yi Ding and incorporated herein by reference.

Figure 11:
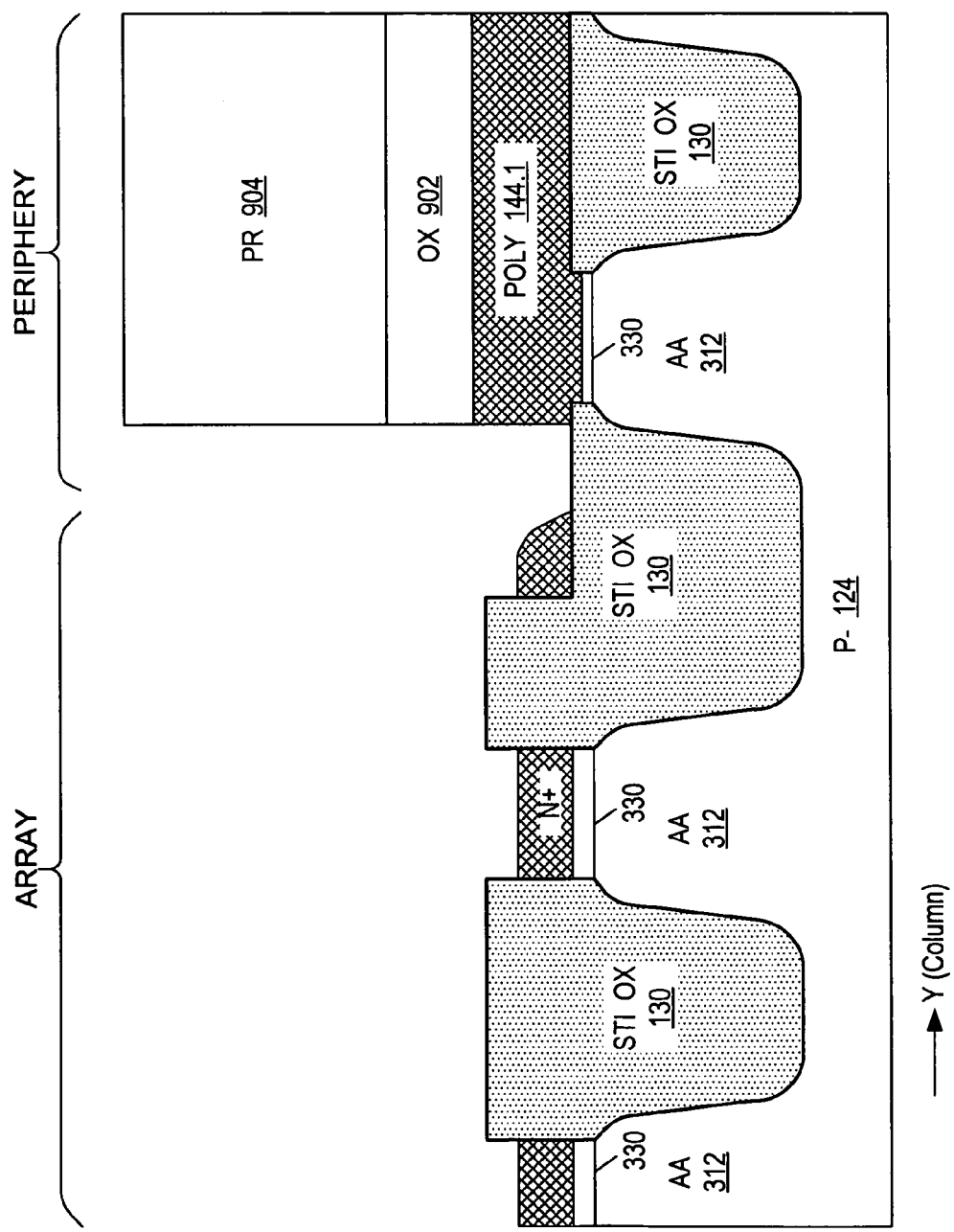

The periphery is protected by resist 904, and remains as in FIG. 11.

As seen in FIG. 3D, the recessed sidewalls of oxide 130 will allow the top surface of floating gates 120 to extend over the oxide 130, possibly beyond the active areas 312, advantageously increasing the capacitive coupling between the floating and control gates.

Figure 13A:
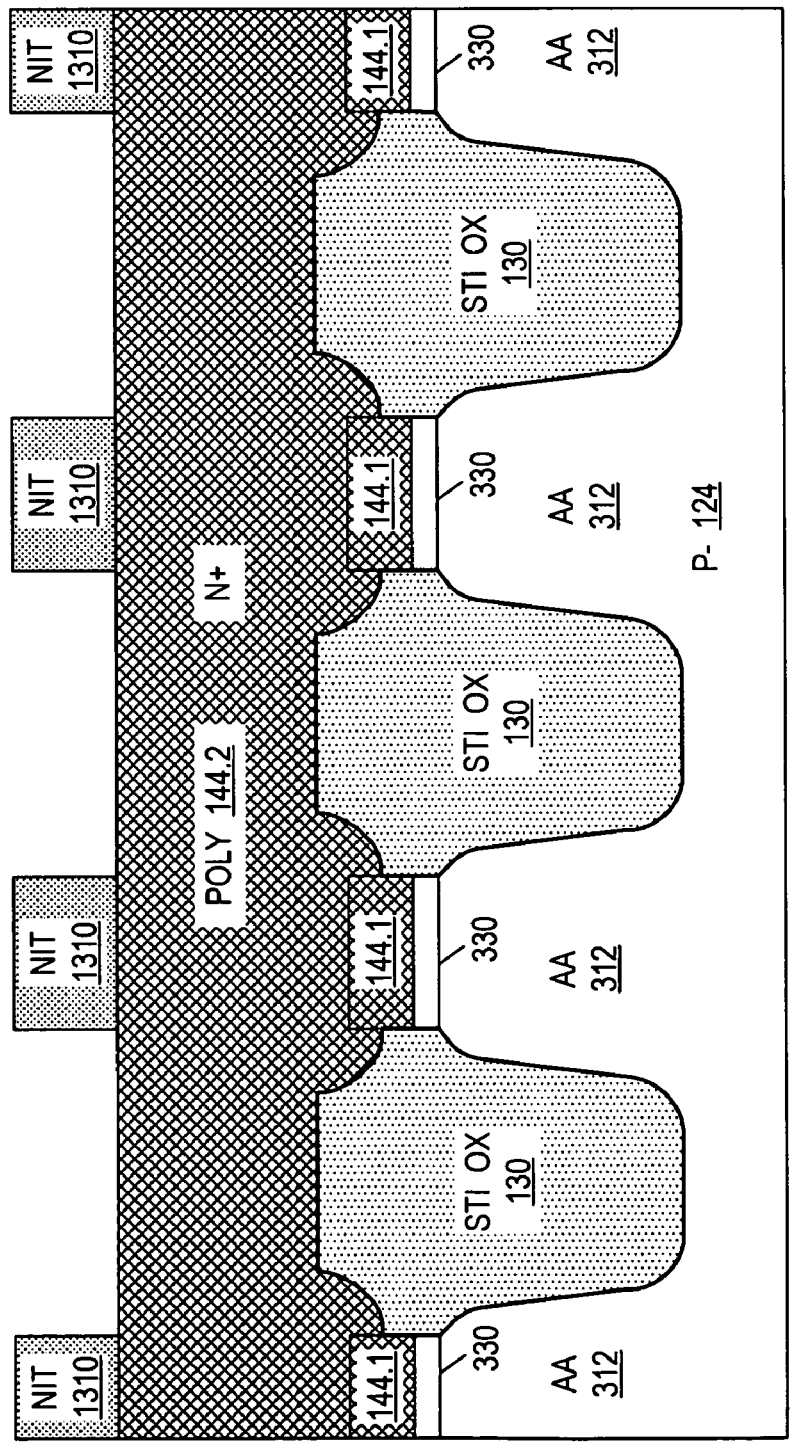

Resist 904 is removed. Polysilicon layer 144.2 (FIG. 13A, cross section Y, and FIG. 13B, periphery) is deposited on the structure, and is doped N+ during or after the deposition. Layer 144.2 will provide portions of the select gates 144S. An exemplary deposition process is conformal low pressure chemical vapor deposition (LPCVD). The thickness of layer 144.2 (at least 2000 Å in some embodiments) is chosen to provide a planar top surface. The planar top surface is not necessary however.

Polysilicon layers 144.1, 144.2 are shown as a single layer 144S in the array area in some of the drawings.

Figure 14A:
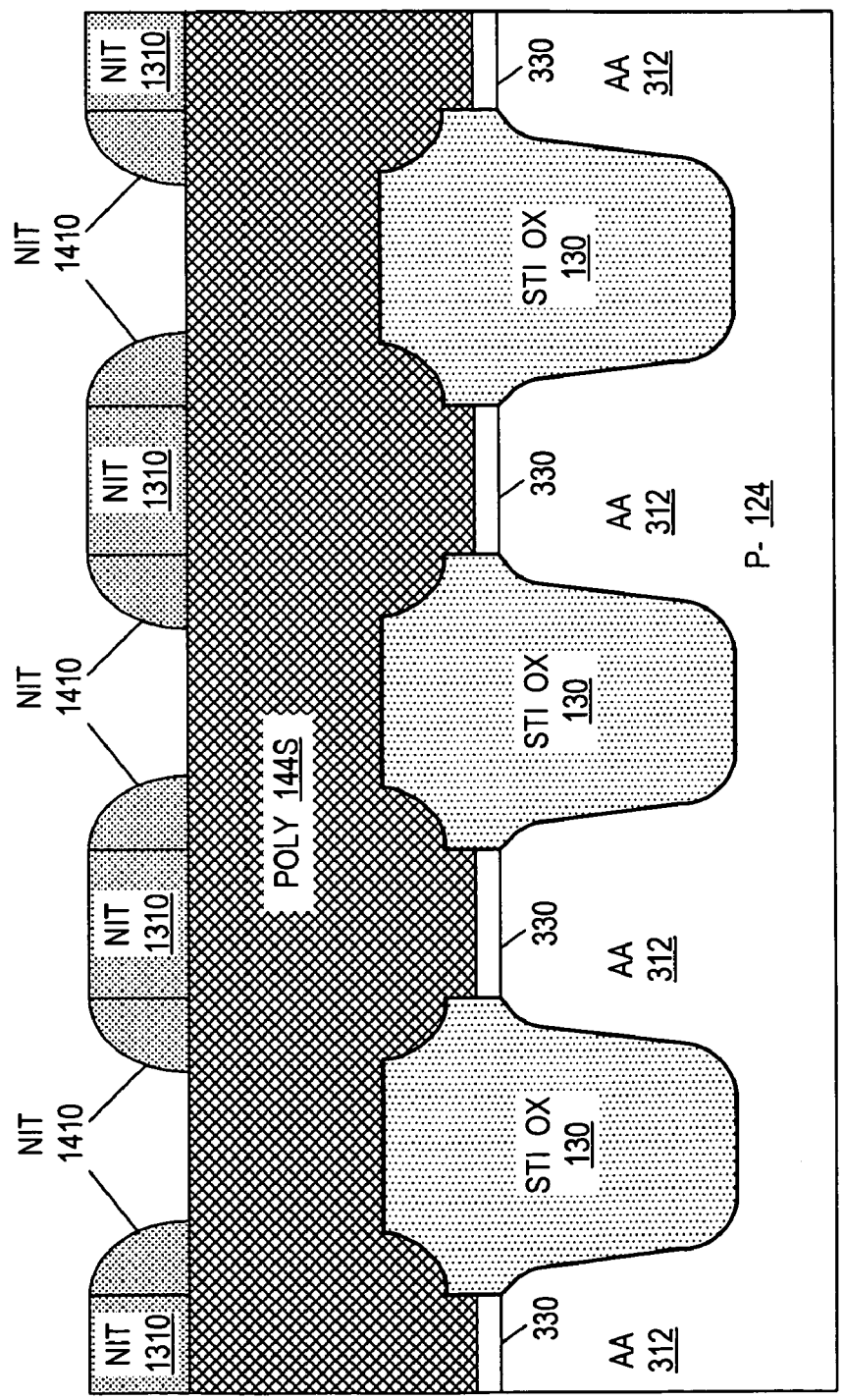

A hard mask for an etch of polysilicon layers 144.1, 144.2 is formed in two steps. First, silicon nitride layer 1310 is deposited and patterned photolithographically to form the same pattern in the array area as was used to define active areas 312 (FIG. 4). Nitride 1310 covers the entire periphery. Next, a conformal silicon nitride layer 1410 (FIG. 14A, cross section Y) is deposited and etched anisotropically without a mask to form spacers on the sidewalls of nitride 1310. Nitride 1410 is etched off the periphery during this step, so the periphery remains as in FIG. 13B. Nitride spacers 1410 will ensure that the select gates 144S will overlap the top planar surface of STI oxide 130 even if nitride 1310 is not perfectly aligned with active areas 312.

Alternatively, nitride 1310 can be removed from the periphery when the nitride 1310 is patterned in the array area. Nitride 1410 will also be removed from the periphery during the etch that forms the nitride spacers in the array area. The resulting peripheral cross section for this case is shown in FIG. 14B.

Figure 15A:
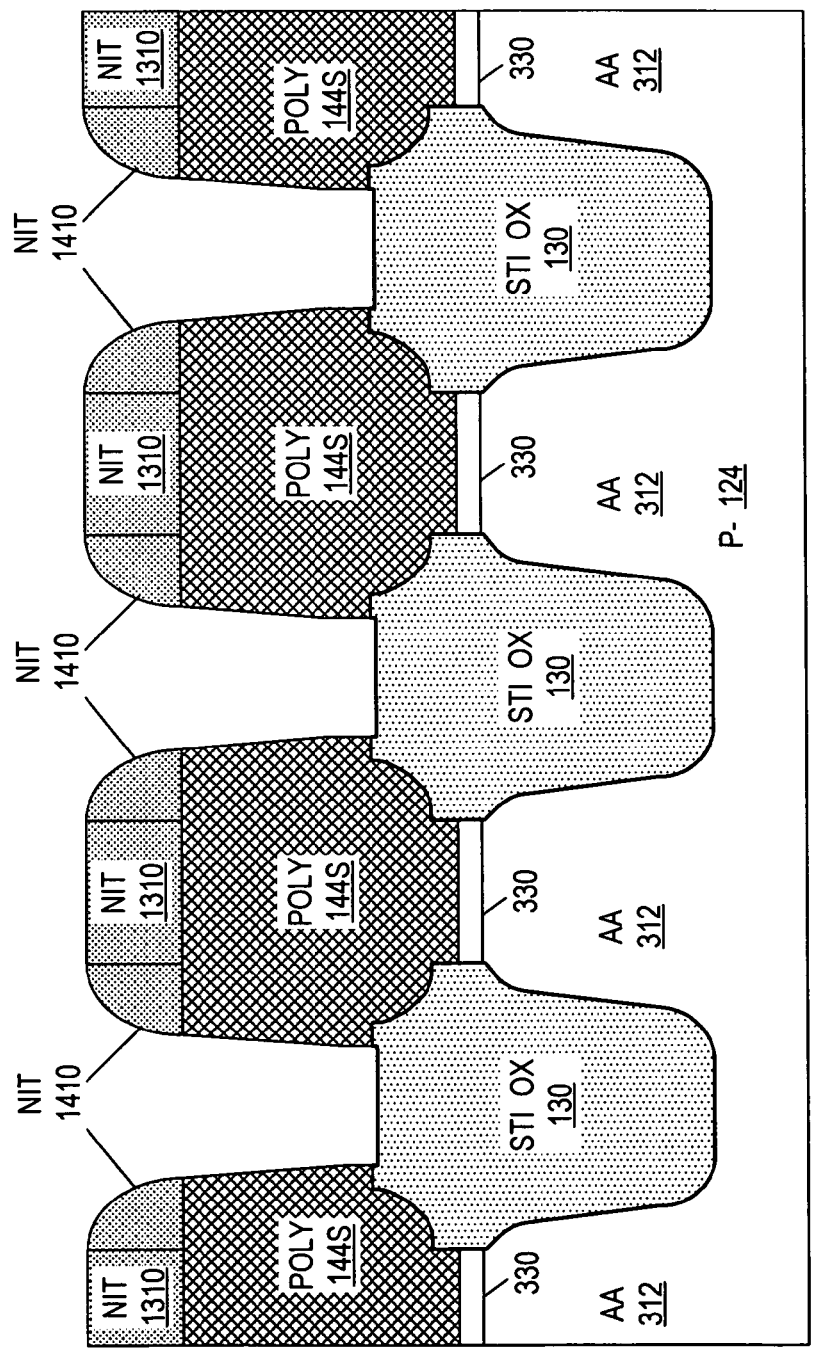
Figure 15B:
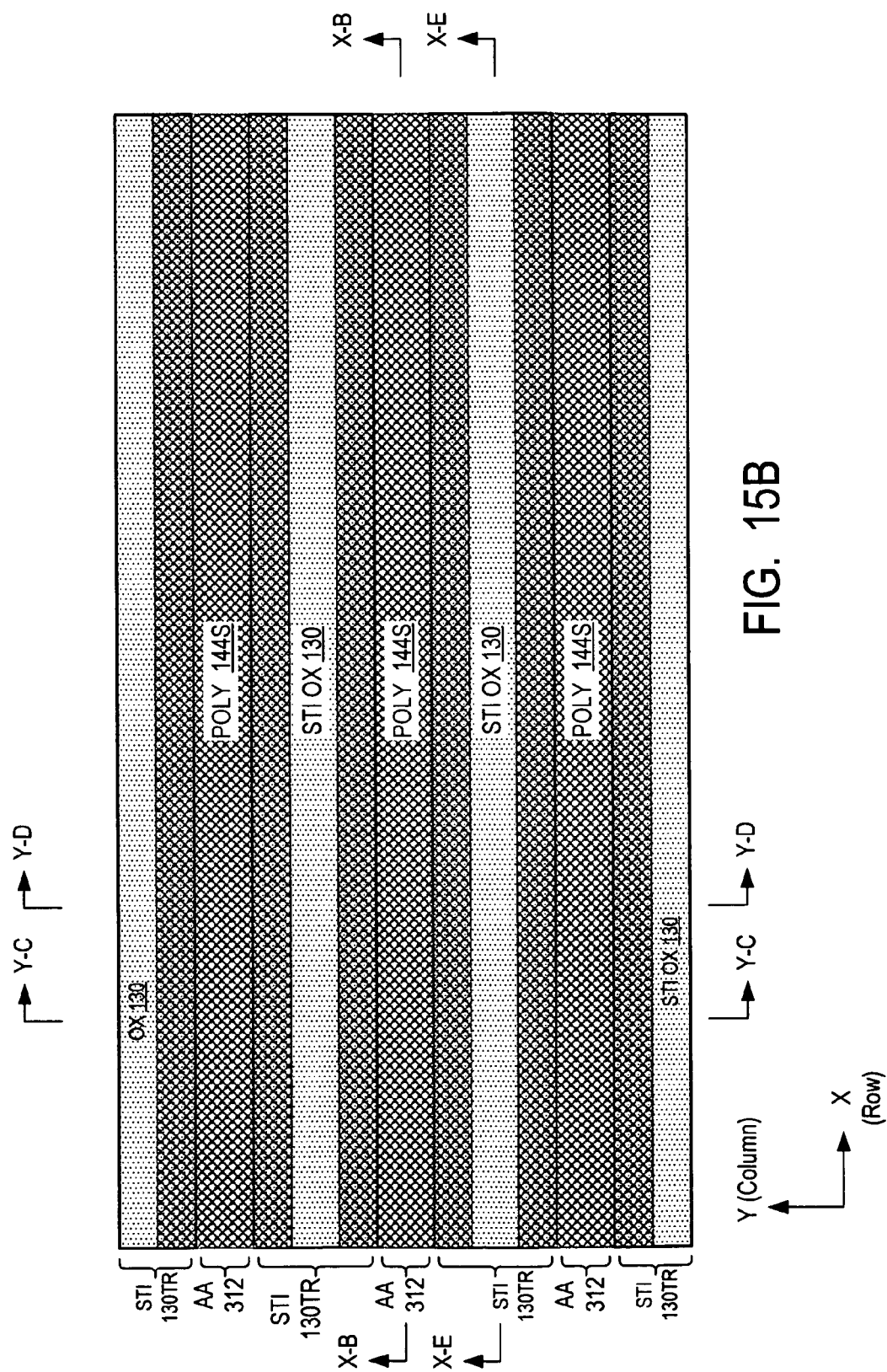
FIG. 15B is a top view of a memory structure in the process of fabrication according to one embodiment of the present invention.

An anisotropic etch of polysilicon 144S (FIG. 15A, cross section Y, and FIG. 15B, top view of the array) stops on STI oxide 130. Some of oxide 130 may be removed by an overetch. Polysilicon 144S forms a number of strips (FIG. 15B); each strip runs through the memory array in the X direction over an active area 312. (Nitride layers 1310, 1410 are not shown in FIG. 15B.)

If the periphery was as in FIG. 13B, it will not be affected by the polysilicon etch. If the periphery was as in FIG. 14B, polysilicon 144.2 will be removed from the periphery, as shown in FIG. 15C.

Advantageously, the array structure is essentially self-aligned at this stage. The positions of trenches 130TR, oxide 130 and polysilicon 144S does not depend on photolithographic alignment except for the alignment of the mask used to pattern the nitride 1310 with respect to the mask used to pattern the trenches 130TR (FIG. 4). A misalignment between these two masking steps may cause a shift of polysilicon strips 144S relative to oxide 130 in the Y direction, but the shift is not believed to affect the memory characteristics if nitride spacers 1410 are sufficiently wide to ensure the overlap of the polysilicon strips onto the top surface of oxide 130 (as in FIG. 15A).

Nitride layers 1310, 1410 are removed from the wafer (by a wet $H_3PO_4$ etch for example). Silicon nitride 1610 (FIG. 16A, cross section Y) is deposited over the structure to provide a planar top surface (the planar top surface is not necessary however). The peripheral cross section is shown in FIGS. 16B, 16C for the cases of FIGS. 13B, 15C respectively. An exemplary thickness of nitride 1610 over the top surface of polysilicon 144S is in the range of 500–1500 Å. A SION or silicon dioxide layer 1620 is formed on nitride 1610 to provide additional protection for a subsequent polysilicon etch that will define the select gates 144S. Layer 1620 is not needed if nitride 1610 is sufficiently thick (1500 Å for example).

Figure 17A:
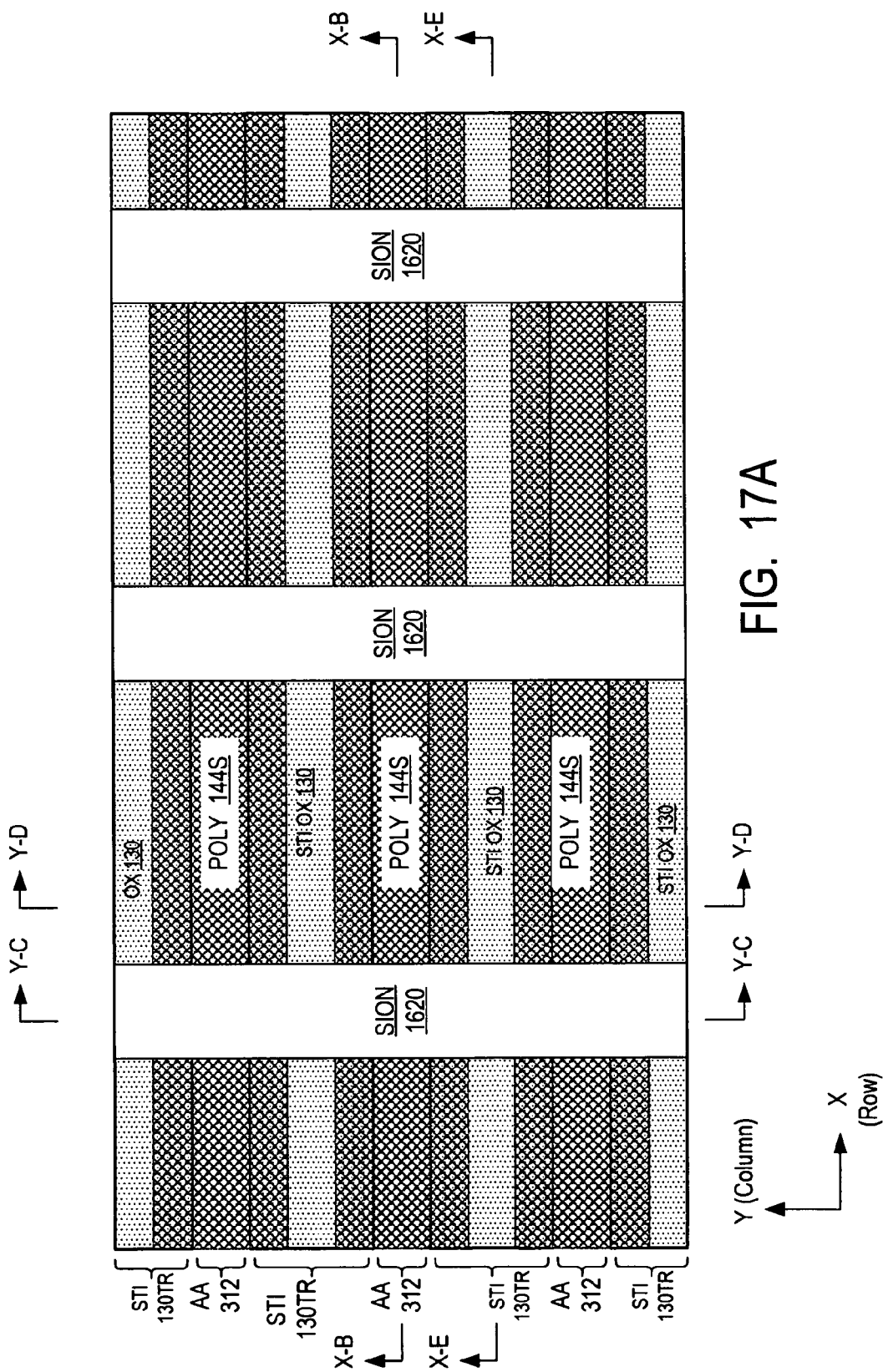
FIG. 17A is a top view of a memory structure in the process of fabrication according to one embodiment of the present invention.

Layers 1610, 1620 are patterned photolithographically using a photoresist layer (not shown) to form a number of strips running through the array in the Y direction over the future positions of select gates 144S. See FIG. 17A (top view of the array). The photolithographic step is not alignment-sensitive in the array area because any misalignment will simply shift the strips 1610, 1620 in the X direction and will not affect the array geometry. Layers 1610, 1620 are removed from the periphery during this step, as shown in FIG. 17B (for the case of FIG. 16B) and FIG. 17C (for the case of FIG. 16C).

The resist used to pattern the layers 1610, 1620 can be removed at this stage, or can be left in the structure for the etch of polysilicon 144S. Polysilicon 144S is etched anisotropically to form the select gates 144S. The etch is selective to SION 1620 and nitride 1610, or at least to the resist if the resist is present. See FIG. 18A showing the cross section X-B (marked in FIG. 3F), and FIG. 18B showing the cross section X-E. A dashed line in FIG. 18A shows the position of the top surface 130T of STI oxide 130 between select gates 144S (see also FIG. 16A). In the case of FIG. 17B, polysilicon 144.2 is removed from the periphery during this etch, so the periphery becomes as in FIG. 17C. See also FIG. 18C, showing the periphery both for the case of FIG. 17B and the case of FIG. 17C after the polysilicon etch.

If the resist was present during the polysilicon etch, the resist is removed. The wafer is oxidized (in a furnace or by rapid thermal oxidation (RTO)) to grow silicon dioxide 314 (FIG. 18A) on substrate 124. During this step, silicon dioxide 1820 grows on the sidewalls of polysilicon gates 144S in the array area, and a thin oxide layer 1830 grows on the vertical sidewalls of nitride 1610. Oxide 1830 may also form on the top surface of nitride 1610 if SION 1620 is omitted. Oxide 314 will serve as the tunnel oxide (the gate oxide for the floating gate transistors). Oxide 1820 will provide sidewall insulation for the select gates. The oxide thickness depends on the dopants and dopant concentrations, and is chosen based on a desired memory cell performance. In one embodiment, oxide 314 is 60–100 Å thick, and oxide 1820 is 250–450 Å thick (due to the heavier doping of select gates 144S).

The peripheral area is covered by oxide 902 (FIG. 18C), and is not affected by the oxidation.

Floating gate polysilicon 120 (FIG. 19, cross section X-B) is deposited over the structure, by LPCVD for example, and is doped during or after the deposition. Polysilicon 120 is sufficiently thick to ensure that its top surface is at least as high throughout the wafer as the surface 130T (FIG. 16A) of STI oxide 130. In the embodiment of FIG. 19, the polysilicon surface is planar except for protrusions over the select gates 144S. The surface 120T of polysilicon 120 between the STI regions 130 is planar due to a conformal polysilicon deposition if the maximum distance D1 (FIGS. 3A, 3D) between adjacent STI oxide regions 130 above substrate 124 is not larger than twice the thickness Th1 (FIG. 19) of polysilicon 120, i.e. $D1 \leq 2*Th1$. The polysilicon protrusions over select gates 144S (FIG. 19) are obtained if twice the thickness Th1 of polysilicon 120 is smaller than the distance D2 between the adjacent structures consisting of select gates 144S and oxide 1820 (see also FIG. 18A). In summary, $$D1 \leq 2*Th1 < D2.$$

In some 0.18 μm minimum line width embodiments, D1 is 0.16–0.2μ, D2 is 0.58 μm, and Th1 is at least 0.08 μm but less than 0.29 μm.

In other embodiments, the polysilicon surface is planar over the whole wafer due to a conformal deposition to a thickness larger than half the distance D2 and larger than half the distance D1. See U.S. patent application Ser. No. 10/440,508 filed May 16, 2003 by Yi Ding and incorporated herein by reference.

In other embodiments, the polysilicon 120 is not planar even in the areas between select gates 144S. For example, polysilicon 120 can have protrusions over STI oxide regions 130.

Polysilicon 120 is etched without a mask. In the embodiment of FIG. 19, this can be an isotropic dry etch. The etch end point is the exposure of oxide surface 130T. See FIGS. 20A (cross section X-B) and 20B (cross section Y-D). The etch removes polysilicon 120 over the select gates 144S, and also removes SION 1620. The remaining polysilicon 144S fills the areas between protruding oxide features 130 and select gates 144S. Oxide layers 1820, 1830 become exposed. Oxide 1830 protects the nitride 1610 during the etch, and may be partially or completely removed by this etch. The polysilicon etch removes polysilicon 120 from the periphery, so the periphery becomes as in FIG. 18C.

Anisotropic etches can also be used, especially if polysilicon 120 is initially planar throughout the wafer. If the polysilicon is not planar, it can be planarized before the anisotropic etch.

An optional etch of oxide 130 lowers the top surface of oxide 130 to a level below the top surface of polysilicon 120 (FIG. 21, cross section Y-D) to increase the capacitive coupling between floating gates 120 and control gates 134 (FIG. 3D). See the aforementioned U.S. Pat. No. 6,355,524. The oxide etch can be an anisotropic dry etch. Some of oxide 902 can be removed in the periphery by this etch (see FIG. 18C).

As noted above in connection with FIG. 12, the recessed sidewalls of oxide 130 allow the floating gates to be wider at the top (by the amount Ls) and to possibly extend beyond the active areas 312. See also FIGS. 3A, 3B, 3D. The lateral extensions of the floating gates increase the capacitive coupling between the floating gates and the control gates 134 and increase the gate coupling ratio. Also, due to the lateral extensions, the spacing between the floating gates is reduced, possibly below the minimum line width, thus allowing a more efficient use of the wafer area. In one embodiment, the spacing Sf (FIGS. 3D, 21) between the adjacent floating gates is only 0.05–0.06 μm for the dimensions given above in connection with FIG. 12.

The wafer is cleaned for subsequent processing. The cleaning step removes any oxide 1830 (FIGS. 18A, 18B, 20A) that may have remained in the structure after the isotropic etch of polysilicon 120.

Insulating layer 324 (FIG. 22A, cross section X-B, FIG. 22B, cross section X-E, and FIG. 22C, periphery), e.g. ONO, is formed over the structure. A conductive layer 134, e.g. doped polysilicon, is deposited over ONO 324. In the embodiment shown, layer 134 is deposited conformally to a thickness of 1000–1800 Å, although neither the conformal deposition nor the thickness range are necessary. Polysilicon 134 forms protrusions 134P over the select gates 144S and nitride features 1610. Each protrusion 134P is a continuous ridge running through the array over one column of select gates 144S and nitride features 1610 in the Y direction. Protrusions 134P will be exploited to form the control and floating gates in a self-aligned manner, as described below.

The width W1 of polysilicon 134 over the sidewalls of gates 144S will define the width of the control and floating gates. In case of a conformal deposition, W1 is equal to the thickness of layer 134.

As shown in FIGS. 22A and 22B, cavities 134C form in layer 134 between protrusions 134P. These cavities are filled with some material 2210. In one embodiment, material 2210 is silicon dioxide deposited on polysilicon 134 and planarized by CMP or some other process. The CMP stops when the polysilicon 134 becomes exposed, and then a short wet etch (wet dip) of oxide 2210 is performed to ensure that the oxide 2210 will have vertical sidewalls (the oxide could initially be rounded due to the rounded profile of polysilicon 134). Alternatively, the CMP can stop on ONO 324 and/or nitride 1610.

In the embodiment of FIG. 23C, the CMP removes the oxide 2210 from the peripheral area, although this is not necessary.

Polysilicon 134 is etched without a mask selectively to oxide 2210. See FIG. 23A (cross section X-B), FIG. 23B (cross section X-E), and FIG. 23C (periphery). This can be an anisotropic etch which attacks the polysilicon protrusions 134P and creates cavities 2310 in the top surface of the structure. Each cavity 2310 is a continuous cavity running through the array in the Y direction. Polysilicon 134 is recessed relative to oxide 2210 in these cavities. This etch exposes ONO 324 on top of select gates 144S and nitride features 1610. In the embodiment of FIGS. 23A, 23B, this etch continues for some time after the exposure of ONO 324 to recess the polysilicon 134 below the top surface of ONO 324. This is not necessary however. The final height Hcg of polysilicon 134 in cavities 2310 (near the select gates 144S) will define the thickness of the control gates. In some embodiments, Hcg is about 500–1000 Å, and is less than the thickness of polysilicon 134 under oxide 2210.

The polysilicon etch removes polysilicon 134 from the periphery (FIG. 23C).

Dielectric 302 is deposited into cavities 2310 to protect the polysilicon 134 (the future control gates) near the select gates 144S and nitride features 1610. In one embodiment, this material is silicon nitride. As shown in FIGS. 23A, 23B, 23C, nitride 302 can be deposited over the structure conformally to a thickness sufficient to obtain a planar top surface over the array and the periphery. A planar top surface is not necessary however.

Nitride 302 is etched to expose oxide 2210. See FIGS. 24A (cross section X-B), 24B (cross section X-E), and 24C (periphery). This can be a dry or wet etch or a CMP. The etch can be terminated before the exposure of ONO 324. The etch can reduce the thickness of nitride 302 in the periphery or remove the nitride. In the example of FIG. 24C, the nitride is removed.

The periphery is covered by photoresist (not shown). Oxide 2210 is removed (by a wet etch for example). See FIGS. 25A (cross section X-B), 25B (cross section X-E).

Polysilicon 134 is etched anisotropically in the array area with nitride 302 as a mask. The polysilicon etch is selective to silicon dioxide, so the etch stops on ONO 324. The resulting structure is shown in FIGS. 26A (cross section X-B), 26B (cross section X-E). This etch patterns the control gate lines.

The periphery continues to be covered by the resist (not shown) deposited before the etch of oxide 2210, and the periphery thus remains as in FIG. 24C.

ONO 324 and polysilicon 120 are etched with nitride 302 as a mask to pattern the floating gates. Layers 324, 120 are completely removed from the areas not covered by nitride 302. See FIGS. 27A (cross section X-B), 27B (cross section X-E). The periphery continues to be covered by the resist, and is unchanged. In the array area, nitride 302 and STI oxide 130 can be partially removed during the etch of ONO 324. In some embodiments, the ONO etch may also remove the ONO over the top of nitride 1610 and attack the nitride 1610.

Then bitlines 138 are created by a "self-aligned source" technique. More particularly, as the peripheral area continues to be masked with the resist (not shown), a silicon dioxide etch selective to silicon nitride removes the exposed oxide 130 from trenches 130TR. See FIG. 28A (cross section X-E) and FIG. 3E. The exposed portions of oxide 314 are also removed by this etch (FIG. 28B, cross section X-B). Substrate 124 becomes exposed in the bitline areas 138 (FIG. 3F). Dopant is implanted into these areas to form the bitlines. In an exemplary embodiment, a combination of a shallow arsenic implant and a deep phosphorus implant are used for the bitlines.

The resist is removed from over the periphery. The periphery remains as in FIG. 24C.

The structure is oxidized to grow a silicon dioxide layer 2910 (FIG. 29, cross section X-B, and FIG. 3E) on the sidewalls of floating gates 120 and control gates 134 and on the exposed portions of substrate 124. This step repairs the damage to oxide 314 caused by the etch of polysilicon 120 that formed the floating gates (FIG. 27A). Oxide 2910 is a thin layer whose thickness depends on the doping of the underlying silicon surfaces. The periphery remains as in FIG. 24C.

The array is covered with photoresist (not shown). ONO 324 and oxide 902 (FIG. 24C) are removed in the periphery (possibly with a dry etch). The resist is removed, and another photoresist layer (not shown) is formed to define the peripheral transistor gates. Polysilicon 144.1 is patterned in the periphery to form these transistor gates (FIG. 30). The resist is removed. Then LDD (lightly doped drain) extensions for peripheral source/drain regions 3008 are formed by ion implantation for the PMOS and NMOS transistors using appropriate photoresist masks (not shown). A thin pad layer 3010 of silicon dioxide is grown on the top and sidewall surfaces of peripheral gates 144.1 using known techniques.

Silicon nitride spacers 304 (FIG. 31, periphery, and FIGS. 3B and 3E) are formed by a conformal deposition and an anisotropic etch of silicon nitride. Then N+ and P+ implants are performed to finish the doping of source/drain regions 3008 for the peripheral transistors. The peripheral PMOS gates 144.1 are doped P+, and the peripheral NMOS gates are doped N+, during the source/drain doping. Surface channel transistors are formed in the periphery as a result. Appropriate masking steps are used to block these implants from the wafer areas in which the doping is undesirable. Then a wet silicon dioxide etch is performed to remove the exposed portions of oxide 3010 (FIG. 30) over the peripheral silicon source/drain regions 3008. A metal (e.g. cobalt) is deposited over the wafer, and the wafer is heated to form conductive metal silicide layers 144L, 3008L on peripheral gates 144.1 and source/drain regions 3008 respectively. The unreacted metal is removed.

The remaining processing is conventional. In one example, interlevel dielectric 310 is formed over the structure, to an exemplary thickness of 2000–5000 Å. Contact openings are etched in dielectric 310 and nitride 304 to select gates 144S, control gates 134, peripheral transistor gates 144.1 (i.e. to silicide 144L), and source/drain regions 3008 (i.e. to silicide 3008L). The contact openings are filled with metal 350, then metal 144 is deposited and patterned to form the wordlines and perhaps other features.

The invention is not limited to the embodiments described above. The invention is not limited to the dimensions, materials or voltages shown, or to STI, silicidation, or other processes. Other techniques can be used to pattern the floating and control gates. See for example U.S. patent application Ser. No. 10/393,202 filed by Yi Ding on Mar. 19, 2003, and U.S. patent application Ser. No. 10/631,941 filed by Yi Ding on Jul. 30, 2003, both incorporated herein by reference. In FIGS. 3A–3F, wordlines 144 are perpendicular to control gate lines 134 and bitlines 138, but this is not necessary. The invention is applicable to non-silicon semiconductor memories. The invention is not limited to a memory erased through the substrate, or to any reading, erase or programming methods. The invention covers both flash and non-flash memories. Other embodiments and variations are within the scope of the invention, as defined by the appended claims.

The invention claimed is:

1. A method for manufacturing an integrated circuit, the method comprising:
(a) forming a plurality of first conductive gates for non-volatile memory cells, the first conductive gates being spaced from each other and not electrically interconnected;
(b) forming a plurality of conductive floating gates for the memory cells;
(c) forming a plurality of conductive gate lines each of which provides second conductive gates for one column of the memory cells, wherein the adjacent conductive lines for the adjacent columns are spaced from each other;
(d) forming at least one conductive line electrically interconnecting two or more of the first conductive gates.

2. The method of claim 1 wherein the first conductive gates are formed before the floating gates and the second conductive gates.

3. The method of claim 2 wherein the conductive line is formed after the first conductive gates, the floating gates, and the second conductive gates.

4. The method of claim 1 wherein the conductive line is formed after the first conductive gates, the floating gates, and the second conductive gates.

5. The method of claim 1 further comprising, after forming the first conductive gates and at least one of the floating gates and the second conductive gates, forming a dielectric to insulate the at least one of the floating gates and the second conductive gates from the conductive line, wherein the dielectric is at least 2000Å thick.

6. The method of claim 5 wherein the dielectric is at least 3000Å thick.

7. The method of claim 1 wherein the first conductive gates comprise a semiconductor material, and the conductive line is a metal line.

8. The method of claim 1 wherein each conductive line interconnects the first conductive gates for at least one row of the memory cells.

9. The method of claim 1 wherein the conductive gate lines are perpendicular to the conductive lines.

10. The method of claim 1 further comprising forming substrate isolation regions in the semiconductor substrate between active areas of the semiconductor substrate, each substrate isolation region being a dielectric region protruding above the semiconductor substrate;
wherein the operation (a) comprises forming first gate structures protruding above the semiconductor substrate, each first gate structure overlying at least one active area, wherein each first gate structure comprises one of the first conductive gates;

wherein the operation (b) comprises:

(b1) forming a conformal layer ("FG layer") over the first gate structures and the substrate isolation regions, wherein each floating gate comprises a portion of the FG layer, wherein a maximum distance between points of the adjacent substrate isolation regions above the substrate is not greater than one half of a thickness of the FG layer, and one half of the thickness of the FG layer is smaller than a distance between the adjacent first gate structures; and (b2) isotropically etching the FG layer to expose the substrate isolation regions and to remove the FG layer from over at least a portion of each first gate structure.

11. The method of claim 1 further comprising forming substrate isolation regions in the semiconductor substrate between active areas of the semiconductor substrate, each substrate isolation region being a dielectric region protruding above the semiconductor substrate;

wherein the operation (a) comprises forming first gate structures protruding above the semiconductor substrate, each first gate structure overlying at least one active area, wherein each first gate structure comprises one of the first conductive gates;

wherein the operation (b) comprises:

(b1) forming a conformal layer ("FG layer") over the first gate structures and the substrate isolation regions, wherein each floating gate comprises a portion of the FG layer, wherein the FG layer comprises a planar area between each two adjacent substrate isolation regions and the FG layer comprises a protrusion over each first gate structure; and (b2) isotropically etching the FG layer to expose the substrate isolation regions and to remove the FG layer from over at least a portion of each first gate structure.

12. A method for fabricating an integrated circuit which comprises nonvolatile memory cells, each memory cell having a conductive floating gate and a first conductive gate insulated from each other, the method comprising:

(a) forming substrate isolation regions in a semiconductor substrate between active areas of the semiconductor substrate, each substrate isolation region being a dielectric region protruding above the semiconductor substrate;

(b) forming first gate structures protruding above the semiconductor substrate, each first gate structure overlying at least one active area, wherein each first gate structure comprises at least one first conductive gate;

(c) forming a conformal layer ("FG layer") over the first gate structures and the substrate isolation regions, wherein each floating gate comprises a portion of the FG layer, wherein a maximum distance between points of the adjacent substrate isolation regions above the substrate is not greater than one half of a thickness of the FG layer, and one half of the thickness of the FG layer is smaller than a distance between the adjacent first gate structures;

(d) isotropically etching the FG layer to expose the substrate isolation regions and to remove the FG layer from over at least a portion of each first gate structure;

(e) forming a plurality of conductive gate lines each of which provides second conductive gates for one column of the memory cells, the second conductive gates being insulated from the floating gates, wherein the adjacent conductive lines for the adjacent columns are spaced from each other.

13. The method of claim 12 wherein the operation (d) is terminated with reference to a time of detecting that the substrate isolation regions have been exposed.

14. The method of claim 12 wherein each substrate isolation region traverses an array of the memory cells.

15. The method of claim 12 wherein first gate structures comprise a dielectric over sidewalls of first conductive gates to insulate the first conductive gates from the floating gates.

16. A method for fabricating an integrated circuit which comprises nonvolatile memory cells, each memory cell having a conductive floating gate and a first conductive gate insulated from each other, the method comprising:

(a) forming substrate isolation regions in a semiconductor substrate between active areas of the semiconductor substrate, each substrate isolation region being a dielectric region protruding above the semiconductor substrate;

(b) forming first gate structures protruding above the semiconductor substrate, each first gate structure overlying at least one active area, wherein each first gate structure comprising at least one first conductive gate;

(c) forming a conformal layer ("FG layer") over the first gate structures and the substrate isolation regions, wherein each floating gate comprises a portion of the FG layer, wherein the FG layer comprises a planar area between each two adjacent substrate isolation regions and the FG layer comprises a protrusion over each first gate structure; and (d) isotropically etching the FG layer to expose the substrate isolation regions and to remove the FG layer from over at least a portion of each first gate structure;

(e) forming a plurality of conductive gate lines each of which provides second conductive gates for one column of the memory cells, the second conductive gates being insulated from the floating gates, wherein the adjacent conductive lines for the adjacent columns are spaced from each other.

17. The method of claim 16 wherein the operation (d) is terminated with reference to a time of detecting that the substrate isolation regions have been exposed.

18. The method of claim 16 wherein each substrate isolation region traverses an array of the memory cells.

19. The method of claim 16 wherein first gate structures comprise a dielectric over sidewalls of first conductive gates to insulate the first conductive gates from the floating gates.

* * * * *